United States Patent
Mizukami et al.

(10) Patent No.: US 11,232,990 B2
(45) Date of Patent: Jan. 25, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yuta Mizukami, Tokyo (JP); Tohru Kawai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/121,175

(22) Filed: Dec. 14, 2020

(65) Prior Publication Data

US 2021/0249314 A1      Aug. 12, 2021

(30) Foreign Application Priority Data

Feb. 7, 2020   (JP) .............................. JP2020-019334

(51) Int. Cl.
| H01L 21/8238 | (2006.01) |
| H01L 21/28 | (2006.01) |
| H01L 29/49 | (2006.01) |
| H01L 21/225 | (2006.01) |

(52) U.S. Cl.
CPC .. *H01L 21/823835* (2013.01); *H01L 21/2257* (2013.01); *H01L 21/28052* (2013.01); *H01L 21/28176* (2013.01); *H01L 21/823842* (2013.01); *H01L 29/4933* (2013.01)

(58) Field of Classification Search
CPC ..... H01L 21/823835; H01L 21/823842; H01L 21/28052; H01L 21/2257; H01L 21/28176; H01L 29/4933

See application file for complete search history.

(56) References Cited

U.S. PATENT DOCUMENTS

2002/0090757 A1 *   7/2002   Komori ........... H01L 21/823842
                                                            438/110
2021/0125927 A1 *   4/2021   Chen ................. H01L 21/28088

FOREIGN PATENT DOCUMENTS

JP          2018-166228 A     10/2018

* cited by examiner

*Primary Examiner* — Jose R Diaz
(74) *Attorney, Agent, or Firm* — McDermott Will & Emery LLP

(57) ABSTRACT

A semiconductor device includes a semiconductor substrate, an insulating layer, a semiconductor layers and a silicide layer. The insulating layer is formed on the semiconductor substrate. The semiconductor layer is formed on the insulating layer and includes a polycrystalline silicon. The silicide layer is formed on the semiconductor layer. The semiconductor layer has a first semiconductor part and a second semiconductor part. The first semiconductor part includes a first semiconductor region of a first conductivity type, and a second semiconductor region of a second conductivity type. The second semiconductor part is adjacent the second semiconductor region. In a width direction of the first semiconductor part, a second length of the second semiconductor part is greater than a first length of the first semiconductor part. A distance between the first and second semiconductor regions is 100 nm or more in an extension direction in which the first semiconductor region extends.

19 Claims, 39 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2020-019334 filed on Feb. 7, 2020 including the specification, drawings and abstract is incorporated herein by reference in its entirety.

BACKGROUND

The present application relates to a semiconductor device including a polycrystalline silicon layer whose upper surface is silicided, and to a method of manufacturing the semiconductor device.

There is a disclosed technique listed below.
[Patent Document 1] Japanese Unexamined Patent Application Publication No. 2018-166228

A semiconductor device including a semiconductor substrate, a semiconductor layer formed on the semiconductor substrate, and a silicide layer formed on an upper surface of the semiconductor layer is known (ex. see Patent Document 1). The semiconductor layer of the semiconductor device is a gate wiring including a polycrystalline silicon. The semiconductor layer includes an N-type gate electrode and a P-type gate electrode which are formed integrally with each other as a single member. The semiconductor layer described in Patent Document 1 includes a buffer region whose impurity concentration is low, the buffer region formed between a P-type conductive impurity region and an N-type conductive impurity region. Thus, interdiffusion of the P-type conductive impurity and the N-type conductive impurity is suppressed. As a result, a threshold voltage variation due to the interdiffusion is reduced.

SUMMARY

Of the silicide layer, tensile stress is applied to a part located on the P-type conductive impurity region, and compressive stress is applied to a part located on the N-type conductive impurity region. Therefore, of the silicide layer, the stress in the opposite direction to each other is applied to a part located in a vicinity of a boundary between the N-type conductive impurity region and the P-type conductive impurity region in duplicate.

Further, when the semiconductor layer includes a first semiconductor part having a first width and a second semiconductor part having a second width greater than the first width, further stress is applied to a part formed on the second semiconductor part, of the silicide layer. Therefore, of the silicide layer, a defect is likely to occur in a part located in a vicinity of the second semiconductor part formed on an upper surface of the first semiconductor part whose width is small.

Therefore, a relatively large stress is applied to a part of the silicide layer, the part formed in the upper surface of the first semiconductor part, located in the vicinity of the boundary of the N-type conductive impurity region and the P-type conductive impurity region, and located in the vicinity of the second semiconductor part, as compared with another parts of the silicide layer. As a result, the defect may occur in the silicide layer. Thus, in the conventional semiconductor device, there is room to improve from the viewpoint of increasing the reliability of the semiconductor device.

It is a problem of the embodiment to improve the reliability of the semiconductor device. Other problems and novel features will become apparent from the description of the specification and drawings.

A semiconductor device according to embodiments includes a semiconductor substrate, an insulating layer formed on a main surface of the semiconductor substrate, a semiconductor layer formed on the insulating layer, the semiconductor layer including a polycrystalline silicon, and a silicide layer formed on an upper surface of the semiconductor layer. The semiconductor layer includes a first semiconductor part and a second semiconductor part. The first semiconductor part includes a first semiconductor region of a first conductivity type, and a second semiconductor region of a second conductivity type. In a width direction of the first semiconductor part, the first semiconductor part has a first length. In the width direction, a second length of the second semiconductor part is greater than the first length. A distance between the first semiconductor region and the second semiconductor region in an extending direction in which the first semiconductor region extends is 100 nm or more.

A method of manufacturing a semiconductor device according to embodiments includes: (a) providing a semiconductor substrate; (b) forming an insulating layer on a main surface of the semiconductor substrate; (c) forming a polycrystalline silicon layer on the insulating layer, the polycrystalline silicon layer including a first semiconductor part and a second semiconductor part adjacent the first semiconductor part; (d) implanting an impurity of a first conductivity type into a part of the first semiconductor part to form a first conductivity type region; (e) implanting an impurity of a second conductivity type into another part of the first semiconductor part and the second semiconductor part to form a second conductivity type region; (f) forming a silicide layer on an upper surface of the first conductivity type region and an upper surface of the second conductivity type region. In a width direction of the first semiconductor part, the first semiconductor part has a first length. In the width direction, a second length of the second semiconductor part is greater than the first length. A distance between the first semiconductor region and the second semiconductor region in an extending direction in which the first semiconductor region extends is 100 nm or more.

According to the embodiments, it is possible to improve the reliability of the semiconductor device.

DETAILED DESCRIPTION

Figure 1:
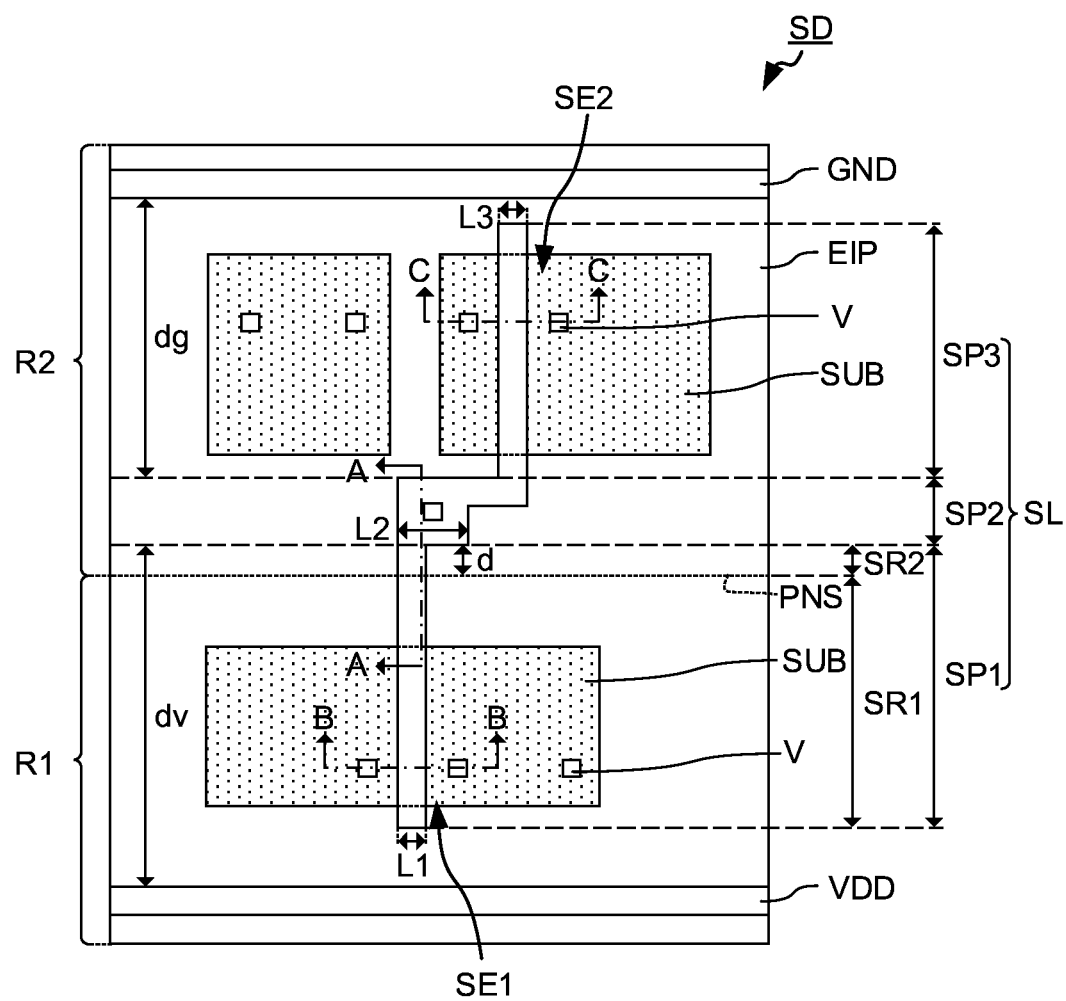
FIG. 1 is a plan view illustrating an exemplary configuration of a main portion of a semiconductor device according to an embodiment.

Hereinafter, a semiconductor device and its manufacturing method according to an embodiment will be described in detail by referring to the drawings. In the specification and drawings, the same or corresponding constituent elements are denoted by the same reference numerals or the same hatching, and overlapping descriptions are omitted. In the drawings, for convenience of description, a configuration may be omitted or simplified. A cross-sectional view may also be shown as an end view.

[Configuration of Semiconductor Device]

Figure 2A:
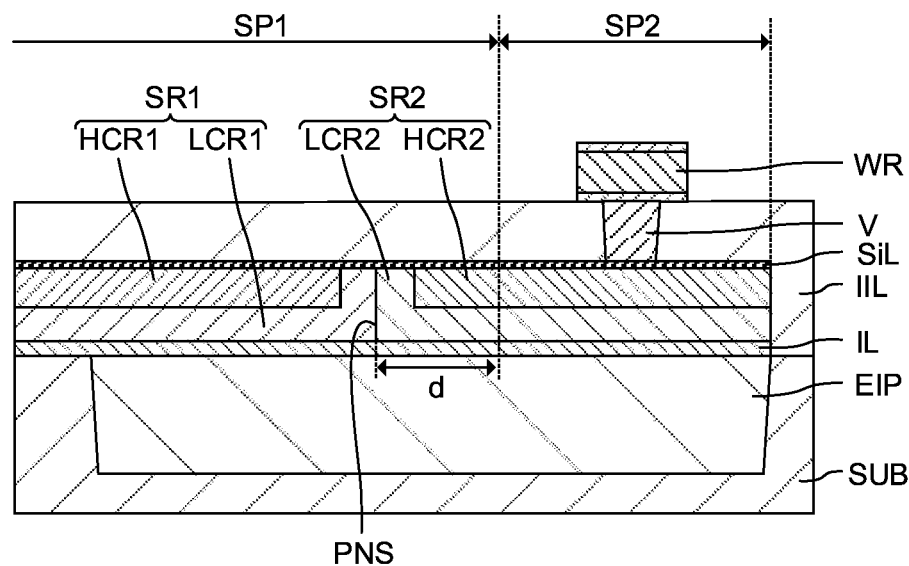
FIGS. 2A to 2C are cross-sectional views illustrating an exemplary configuration of the main portion of the semiconductor device according to the embodiment.
Figure 2B:
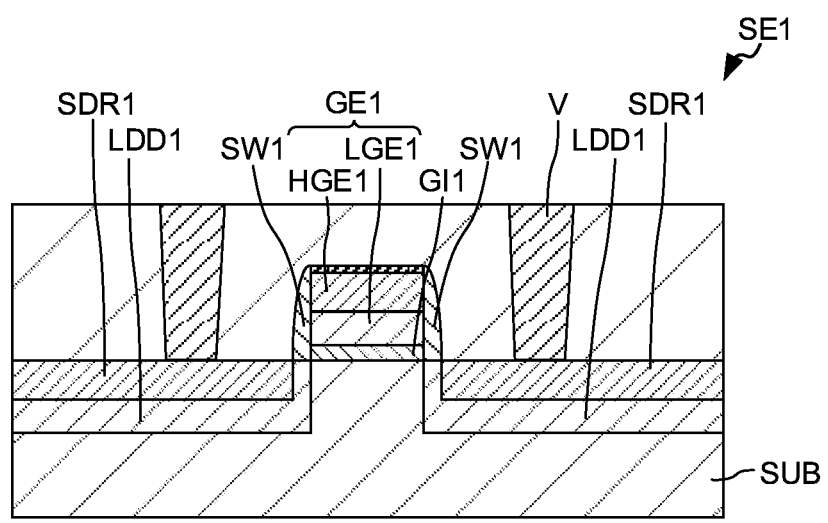
Figure 2C:
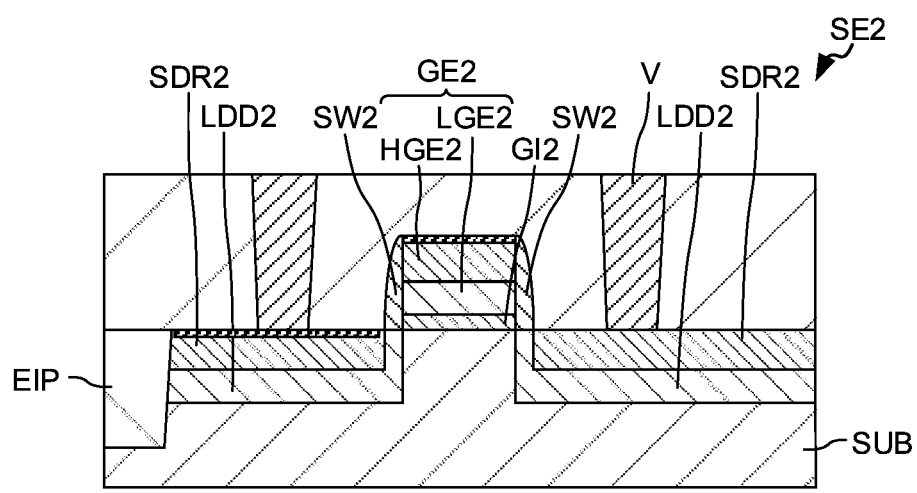

FIG. 1 is a plan view illustrating an exemplary configuration of a main portion of a semiconductor device SD according to a present embodiment. FIGS. 2A to 2C are cross-sectional views illustrating an exemplary configuration of a main portion of the semiconductor device according to the present embodiment. FIG. 2A is a cross-sectional view taken along line A-A of FIG. 1. FIG. 2B is a cross-sectional view taken along line B-B of FIG. 1. FIG. 2C is a cross-sectional view taken along line C-C of FIG. 1.

A semiconductor device SD includes a semiconductor substrate SUB, an element isolation portion EIP, an insulating layer IL, a semiconductor layer SL, and a multilayer wiring layer MWL. In FIG. 1 and FIGS. 2A to 2C, a part of the elements is omitted for the sake of clarity.

(Semiconductor Substrate)

The semiconductor substrate SUB is substrate having a front surface (main surface) and a back surface. The front surface (main surface) is located on an opposite side of the back surface in the semiconductor substrate SUB. The semiconductor substrate SUB is, for example, a silicon substrate. A first semiconductor element SE1 and a second semiconductor element SE2 are formed on the main surface of the semiconductor substrate SUB. In plan view, of the semiconductor substrate SUB, an element formation region is a region in which the first semiconductor element SE1 and the second semiconductor element SE2 are formed is exposed from the element isolation portion EIP. In FIG. 1, the element formation region is indicated by a texture.

The semiconductor substrate SUB includes a first region R1 of the first conductivity type, and a second region R2 of a second conductivity type. The first region R1 is a region in which the first semiconductor element SE1 having the first conductivity type is formed. Second area R2 is a region in which the second semiconductor element SE2 having the second conductivity type is formed. The first region R1 and the second region R2 are adjacent to each other.

The first conductivity type and the second conductivity type are opposite conductivity type to each other. For example, when the first conductivity type is N type, the second conductivity type is P type. When the first conductivity type is N type, an example of an impurity included in the first region R1 includes phosphorus (P), arsenic (As) and antimony (Sb) In addition, when the second conductivity type is P type, an example of an impurity included in the second region R2 includes boron (B) and indium (In).

The first semiconductor element SE1 is formed on the main surface of the semiconductor substrate SUB. The first semiconductor device SE1 is a transistor of the first conductivity type. As a configuration of the first semiconductor element SE1, a known configuration as a semiconductor element is adopted. For example, as shown in FIG. 2B, the first semiconductor element SE1 includes an extension region LDD1, source/drain region SDR1, a gate insulating film GI1, a gate electrode GE1, a silicide layer SiL1, and a sidewall SW1.

The extension region LDD1 is a semiconductor region including an impurity of the first conductivity type, of the semiconductor substrate SUB. The source/drain region SDR1 is semiconductor region having an impurity concentration greater than an impurity concentration of the extension region LDD1. The gate insulating film GI1 is a part of the insulating layer IL to be described later. The silicide layer SiL1 is a part of the silicide layer SiL to be described later. Therefore, detailed descriptions of a configuration of the gate insulating film GI1 and a configuration of the silicide layer SiL1 are omitted here.

The gate electrode GE1 includes a low-concentration gate electrode LGE1 and a high-concentration gate electrode HGE1 formed on the low-concentration gate electrode LGE1. It is preferable that the gate electrode GE1 has a stacked-layer structure of the low-concentration gate electrode LGE1 and the high-concentration gate electrode HGE1 from the viewpoint of suppressing the impurity from diffusing into the gate insulating film GI1 and decreasing the insulating property of the gate insulating film GI1 when the gate electrode GE1 is formed. The gate electrode GE1 is a part of the semiconductor layer SL to be described later. Therefore, detailed descriptions of the gate electrode GE1 is omitted.

The second semiconductor element SE2 is formed on the main surface of the semiconductor substrate SUB. The second semiconductor element SE2 is a transistor of the second conductivity type. As a configuration of the second semiconductor element SE2, a known configuration as a semiconductor element is adopted. For example, the second semiconductor element SE2 includes an extension region LDD2, a source/drain region SDR2, a drain region DR2, a gate insulating film GI2, a gate electrode GE2 and a sidewall SW2, as shown in FIG. 2C. The second semiconductor element SE2, except for location and conductivity type, is similar to the first semiconductor element SE1. For this reason, a description of repetition will be omitted for each element.

(Element Isolation Portion)

The element isolation portion EIP is formed on the main surface of the semiconductor substrate SUB. The element isolation portion EIP is formed such that the element isolation portion EIP surrounds the element formation region in a plan view. Thus, the first semiconductor element SE1 and the second semiconductor element SE2 adjacent to each other are electrically isolated from each other. Material, location, the number, and size of the element isolation portion EIP are not particularly limited as long as the above-mentioned function can be realized. The material of the element isolation portion EIP is, for example, a silicon oxide.

(Insulating Layer)

The insulating layer IL is formed on the main surface of the semiconductor substrate SUB. The insulating layer IL may or may not be formed on the element isolation portion EIP. In the present embodiment, the insulating layer IL is formed on the main surface of the semiconductor substrate SUB and on the element isolation portion EIP. A part of the insulating layer IL is gate insulating film GI1, and another part of the insulating layer IL is the gate insulating film GI2. The insulating layer IL isolates the semiconductor layer SL and the semiconductor substrate SUB from each other. A thickness and a material of the insulating layer IL are not particularly limited as long as the above functions can be obtained. The thickness of the insulating layer IL is appropriately set in accordance with the desired threshold voltage of the first semiconductor element SE1 and the second semiconductor element SE2. The thickness of the insulating layer IL is, for example, 5 nm or less. The material of the insulating layer IL is, for example, a silicon oxide.

(Semiconductor Layer)

The semiconductor layer SL is formed on the insulating layer IL. When the insulating layer IL is not formed on the element isolation portion EIP, the semiconductor layer SL is formed on the element isolation portion EIP. A part of the semiconductor layer SL is the gate electrode GE1, another part of the semiconductor layer SL is the gate electrode GE2. In other words, the semiconductor layer SL is a gate wiring including the gate electrode GE1, GE2. The thickness of the semiconductor layer SL is not particularly limited as long as it can function as the gate wiring. From the viewpoint of suppressing the semiconductor layer SL falls during manufacturing the semiconductor device SD, it is preferable that the thickness of the semiconductor layer SL is small. For example, the thickness of the semiconductor layer SL is preferably 500 nm or less. From the viewpoint of suppressing an impurity ion introduced into the semiconductor layer SL from being introduced into the insulating layer IL and the semiconductor substrate SUB which are located below the semiconductor layer SL during manufacturing the semiconductor device SD, it is preferable that the semiconductor layer SL thickness is large. For example, the thickness of the semiconductor layer SL is preferably 200 nm or more. The material of the semiconductor layer SL is, for example, a polycrystalline silicon having conductivity.

The semiconductor layer SL is formed between a power supply wiring VDD and a ground wiring GND in plan view. The semiconductor layer SL includes a first semiconductor part SP1, a second semiconductor part SP2 and a third semiconductor part SP3. The first semiconductor part SP1, the second semiconductor part SP2 and the third semiconductor part SP3 are integrally formed as a single member.

A part of the first semiconductor part SP1 is formed on the first region R1 of the semiconductor substrate SUB. The other part of the first semiconductor part SP1 is formed on the second region R2 of the semiconductor substrate SUB. Of the semiconductor layer SL, the first semiconductor part SP1 is a part adjacent the gate electrode GE1. The first semiconductor part SP1 includes a first semiconductor region SR1 of the first conductivity type, and a second semiconductor region SR2 of the second conductivity type. A PN junction surface PNS is formed of the first semiconductor region SR1 and the second semiconductor region SR2.

The first semiconductor region SR1 includes a first high-concentration region HCR1 and a first low-concentration region LCR1. The first high-concentration region HCR1 and the first low-concentration region LCR1 are adjacent to each other.

The first high-concentration region HCR1 is formed in the first semiconductor region SR1. In present embodiment, the first high-concentration region HCR1 is formed on an upper surface side of the first semiconductor region SR1. When the first conductivity type is N-type, an impurity concentration of the first high-concentration region HCR1 is preferably, for example, $1\times10^{19}$ cm$^{-3}$ or more and $1\times10^{22}$ cm$^{-3}$ or less. When the first conductivity type is P-type, the impurity concentration of the first high-concentration region HCR1 is preferably $1\times10^{19}$ cm$^{-3}$ or more and $1\times10^{22}$ cm$^{-3}$ or less, for example.

The first low-concentration region LCR1 is formed in the first semiconductor region SR1. The first low-concentration region LCR1 is formed between the first high-concentration region HCR1 and the second semiconductor part SP2. In present embodiment, the first low-concentration region LCR1 is formed on a lower surface side of the first semiconductor region SR1. Thus, during forming the first semiconductor region SR1, an impurity is diffused into the insulating layer IL, it is possible to suppress the insulating property of the insulating layer IL is reduced. The first low-concentration region LCR1 directly contacts with a lower surface and a side surface of the first high-concentration region HCR1 An impurity concentration of the first low-concentration region LCR1 is smaller than the impurity concentration of the first high-concentration region HCR1 When the first conductivity type is N-type, the impurity concentration of the first low-concentration region LCR1 is preferably, for example, $1\times10^{17}$ cm$^{-3}$ or more and $1\times10^{19}$ cm$^{-3}$ or less. When the first conductivity type is P-type, the impurity concentration of the first low-concentration region LCR1 is preferably $1\times10^{17}$ cm$^{-3}$ or more and $1\times10^{19}$ cm$^{-3}$ or less, for example.

The second semiconductor region SR2 includes a second high-concentration region HCR2 and a second low-concentration region LCR2. Since a configuration of the second semiconductor region SR2 is the same as that of the first semiconductor region SR1 except for the location and the conductivity type, the explanation thereof is omitted.

In present embodiment, the second low concentration region LCR2 is formed between the first low-concentration region LCR1 and second high-concentration region HCR2 That is, the PN junction surface PNS is an interface of the first low-concentration region LCR1 and second low-concentration region LCR2 It is preferable that the PN junction surface PNS is an interface of the first low-concentration region LCR1 and the second low-concentration region LCR2 from the viewpoint of making it difficult to generate defects occurring in the silicide layer SiL.

As the impurity concentration of the semiconductor layer SL increases, the stress applied to the silicide layer SiL increases. Of the silicide layer SiL, stress applied to a part located on the first semiconductor region SR1, and stress applied to a part located on the second semiconductor region SR2, are in opposite directions with each other. Therefore, the stresses in the opposite direction to each other is applied to a part located in the vicinity of the PN junction surface PNS in duplicate, of the silicide layer SiL. That is, since the PN junction surface PNS is the interface of the first low-concentration region LCR1 and the second low-concentration region LCR2, the stresses applied to the part located in the vicinity of the PN junction surface PNS can be reduced, of the silicide layers SiL. As a result, in the silicide layer SiL, defects caused by the stress is less likely to occur.

Further, it is preferable that the PN junction is formed only of the first low-concentration region LCR1 and the second low-concentration region LCR2 and is not formed of the first high-concentration region HCR1 and the second high-concentration region HCR2 from the viewpoint of reducing the stress generated at the PN junction surface PNS as compared with the case where the PN junction is formed only of the first high-concentration region HCR1 and the second high-concentration region HCR2.

The first semiconductor part SP1 has a first length L1 in a width direction of the first semiconductor part SP1. Here, the width direction of the first semiconductor part SP1 is, in plan view, a direction perpendicular to a direction in which the first semiconductor part SP1 extends. The first length L1 is not particularly limited, and is appropriately designed in accordance with desired characteristics of the semiconductor device SD, sizes of the second semiconductor part SP2 (a second length L2 to be described later), and the like. The first length L1 is, for example, 100 nm or more.

The second semiconductor part SP2 is formed between the first semiconductor part SP1 and the third semiconductor part SP3 in the semiconductor layer SL. The second semiconductor part SP2 is formed on second region R2 of the semiconductor substrate SUB. The second semiconductor part SP2 is adjacent the semiconductor region SR2 of the first semiconductor part SP1. From the viewpoint of uniform gate voltage applied to the first semiconductor element SE1 and the second semiconductor element SE2, it is preferable that the second semiconductor part SP2 connected with the via V is formed between the gate electrode GE1 of the first semiconductor element SE1, the gate electrode GE2 of the second semiconductor element. The second semiconductor part SP2 is a part of the semiconductor layer SL. The second semiconductor part SP2 has the second conductivity type. Since a configuration of the second semiconductor part SP2 is the same as that of the second semiconductor region SR2 of the first semiconductor part SP1, a description thereof will be omitted.

The second semiconductor part SP2 has a second length L2 in the width direction of the first semiconductor part SP1. The second length L2 is greater than the first length L1. For example, the second semiconductor part SP2 is a part having the second length L2 which is 1.5 times or more of the first length L1, of the semiconductor layer SL. Thus, as compared with the case where the via V is formed on the first semiconductor part SP1, it is possible to reduce an effect of positional deviation due to manufacturing errors. The second length L2 may be greater than a diameter of the via V. The second length L2 is preferably, for example, 150 nm or more. In view of the manufacturing error, it is preferable that, in plan view, a distance between the center (center of gravity) of the via V and a boundary of the first semiconductor part SP1 and the second semiconductor part SP2 in the extending direction of the first semiconductor part SP1 is 150 nm or more.

As will be described later in detail, a distance d between the first semiconductor region SR1 and the second semiconductor part SP2 in the extending direction in which the first semiconductor part SP1 extend is 100 nm or more. In other words, the distance d between the PN junction surface PNS and the second semiconductor SP2 in the extending direction is 100 nm or more. In plan view, as an area of the semiconductor layer SL increases, the stress generated in the semiconductor layer SL increases. Therefore, of the silicide layer SiL, in the part located in the vicinity of the second semiconductor part SP2, there is a tendency that the stress is concentrated. Therefore, it is preferable that a part located in the vicinity of the PN junction surface PNS, of the silicide layer SiL, to which stress caused by the impurity is further applied. And it is preferable that the part is far from the second semiconductor part SP2. As a result, it is possible to suppress the occurrence of defects occurring in the silicide layer SiL. From this viewpoint, the distance d is 100 nm or more.

Incidentally, the first length L1 of the first semiconductor part SP1, and the second length L2 of the second semiconductor part SP2 may vary continuously. In this instance, the distance d is the shortest distance between a location, of the semiconductor layer SL, where second length L2 is 1.5 times or more of the first length L1, and the first semiconductor region SR1 in the extending direction.

The third semiconductor part SP3 is formed on the second region R2 of the semiconductor substrate SUB. The third semiconductor part SP3 is adjacent the second semiconductor part SP2. The third semiconductor part SP3 is a part of the semiconductor layer SL. The third semiconductor part SP3 has the second conductivity type. Since a configuration of the third semiconductor part SP3 is the same as the second semiconductor region SR2 of the first semiconductor part SP1, a description thereof will be omitted.

The third semiconductor part SP3 has a third length L3 in the width direction of the first semiconductor part SP1. The second length L2 is greater than the third length L3. The third length L3 may be the same as the first length L1, or may be different from the first length L1. For example, it is preferable that third length L3 is different from the first length L1 from the viewpoint of equalizing a driving capability of the first semiconductor element SE1 and a driving capability of the second semiconductor element SE2. The third length L3 is, for example, 100 nm or more.

The third semiconductor part SP3, in plan view, may be located on an extension line of the first semiconductor part SP1, or may not be located on the extension line of the first semiconductor part SP1. In present embodiment, the third semiconductor part SP3, in plan view, is not located on the extension line of the first semiconductor part SP1.

(Silicide Layer)

The silicide layer SiL is formed on the upper surface of the semiconductor layer SL. In present embodiment, the silicide layer SiL is formed on an upper surface of the first semiconductor part SP1, an upper surface of the second semiconductor part SP2, and an upper surface of the third semiconductor part SP3. The silicide layer SiL increases the conductivity of the semiconductor layer SL. The thickness and material of the silicide layer SiL are not particularly limited as long as the above-mentioned function can be obtained. The silicide layer SiL is a reaction layer of silicon and metal. An example of a material of the metal includes cobalt (Co), nickel (Ni), platinum (Pt), titanium (Ti) and tungsten (W). From the viewpoint of suppressing a resistance of the semiconductor layer SL from increasing by the defects that may occur in the silicide layer SiL, it is preferable that the thickness of the silicide layer SiL is large. For example, the thickness of the silicide layer SiL is preferably 10 nm or more and 30 nm or less.

(Multilayer Wiring Layer)

The multilayer wiring layer MWL is formed on the semiconductor substrate SUB and the element isolation portion EIP such that the multilayer wiring layer MWL covers the first semiconductor element SE1, the second semiconductor element SE2 and the semiconductor layer SL. The multilayer wiring layer MWL is formed of two or more wiring layers. The wiring layer is a layer including an interlayer insulating layer and one or both of a wiring and a via which are formed in the interlayer insulating layer. The via is a conductive member electrically connecting two wiring formed in layers that differ from each other.

The multilayer wiring layer MWL includes the interlayer insulating layer IIL, the via V, the wiring WR, the power supply wiring VDD and the ground wiring GND. The multilayer wiring layer MWL may further include an interlayer insulating layer, a via and a wiring.

The interlayer insulating layer IIL is formed on the semiconductor substrate SUB and the element isolation portion EIP such that the interlayer insulating layer IIL covers the first semiconductor element SE1, the second semiconductor element SE2 and the semiconductor layer SL. An example of a material of the interlayer insulating layer IIL includes silicon oxide and silicon nitride. A thickness of the interlayer insulating layer IIL is, for example, 0.1 µm or more and 1 µm or less.

The via V is formed in the interlayer insulating layer IIL such that the via V reaches the second semiconductor part SP2 of the semiconductor layer SL. The via V includes, for example, a barrier film and a conductive film formed on the barrier film. An example of a material for the barrier film includes titanium (Ti), titanium nitride (TiN), tantalum (Ta), and tantalum nitride (TaN). An example of a material for the conductive film include tungsten (W) and aluminum (Al). Note that the above barrier film is not an essential component.

The wiring WR is formed on the interlayer insulating layer IIL. As the wiring WR, known configuration employed as wiring in the semiconductor technology can be employed. The wiring WR, for example, is a stacked film in which a barrier metal, a conductive film and a barrier metal are stacked in this order. An example of a material of the barrier metal includes titanium (Ti), titanium nitride (TiN), tantalum (Ta) and tantalum nitride (TaN). An example of a material of the conductive film includes aluminum and copper.

The power supply wiring VDD is configured so that the power supply potential is supplied. The power supply wiring VDD is formed on the interlayer insulating layer IIL. A configuration of the power supply wiring VDD is similar to that of the wiring WR. The power supply wiring VDD, in plan view, extends in the width direction of the first semiconductor part SP1.

The ground wiring GND is configured so that the ground potential is supplied. The ground wiring GND is formed on the interlayer insulating layer IIL. A configuration of the ground wiring GND is similar to that of the wiring WR. The ground wiring GND, in plan view, extends in the width direction of the first semiconductor part SP1.

In plan view, in the extending direction of the first semiconductor part SP1, a distance dv of the power supply wiring VDD and the second semiconductor part SP2 may be greater or smaller than a distance dg of the ground wiring GND and the second semiconductor part SP2. The distance dv may be the same as the distance dg. In present embodiment, the distance dv is greater than the distance dg.

[Simulation 1]

To investigate the stress occurring in the vicinity of the second semiconductor part SP2, a simulation was carried out.

Figure 3:
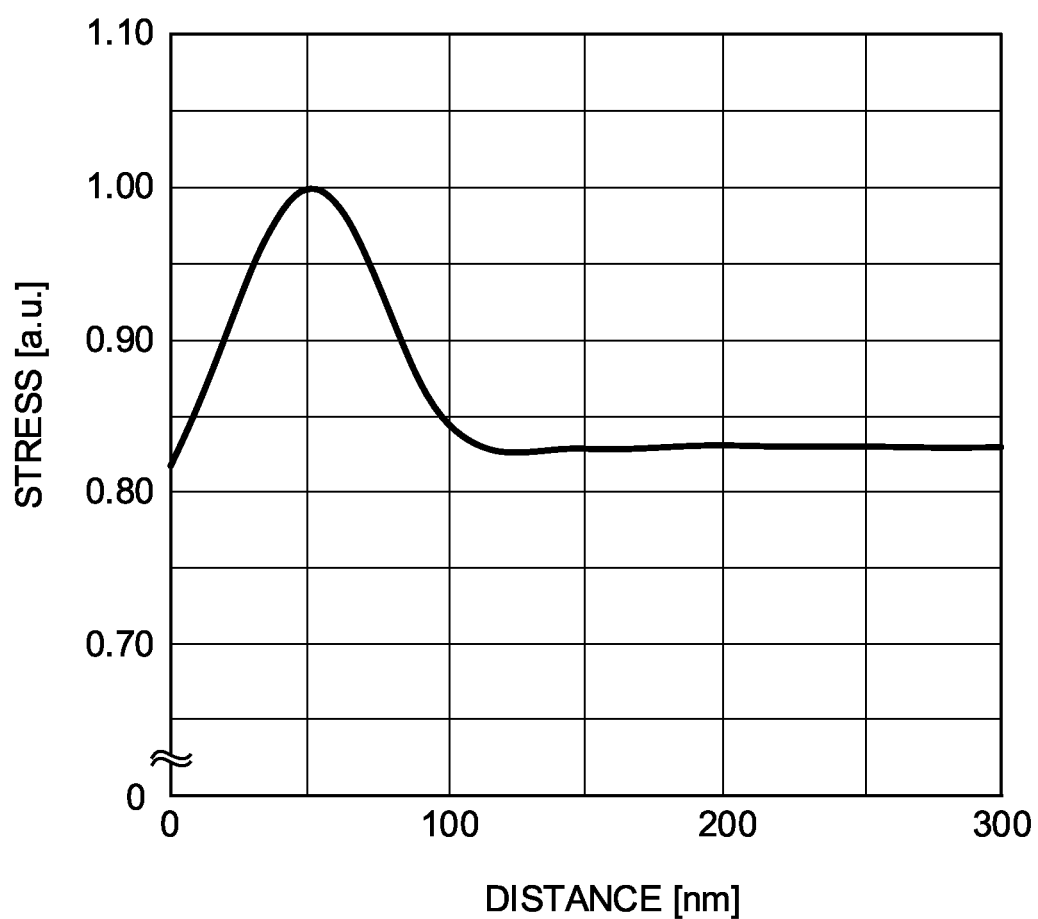
FIG. 3 is a graph showing a simulation result of a simulation 1.

FIG. 3 is a graph showing the simulation result of simulation 1. FIG. 3 is a graph showing a relationship between a distance from the second semiconductor part SP2 and the stress generated in the silicide layer SiL. A horizontal axis indicates the distance [nm] from the second semiconductor part SP2 in the extending direction of the first semiconductor part SP1. A vertical axis indicates a magnitude of the stress normalized.

As it is clear from FIG. 3, when the distance is about 50 nm, the stress becomes maximum. As the distance is greater than about 50 nm, the stress decreases. When the distance is about 100 nm or more, the stress is about the same as the stress when the distance is 0 nm. From the results of this simulation, the PN junction surface PNS in which stress due to the semiconductor layer SL is concentrated should be arranged so that the distance from the second semiconductor part SP2 is about 100 nm or more. Thus, it is possible to suppress the occurrence of defects in a part located in the vicinity of the PN junction surface PNS, of the silicide layer SiL.

[Simulation 2]

Then, in order to investigate an effect of the material of the metal constituting the silicide layer SiL on the magnitude of the stress, a simulation was performed.

Figure 4:
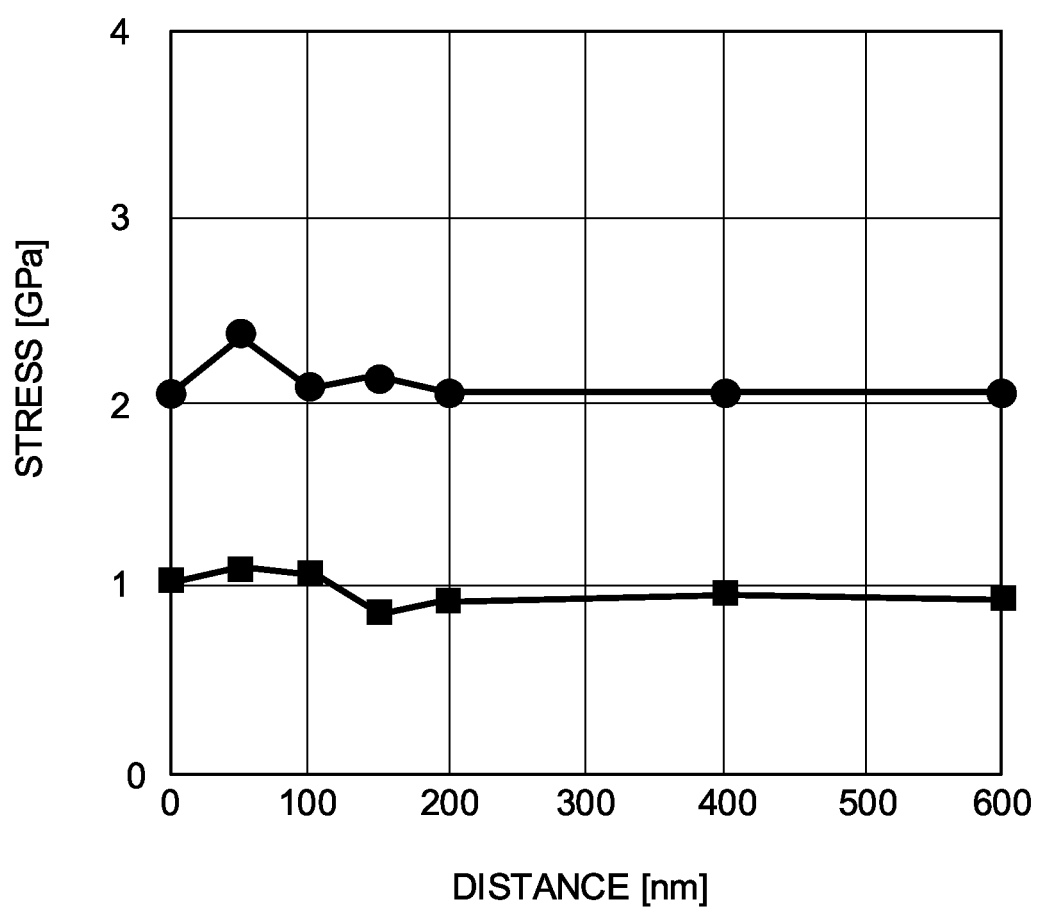
FIG. 4 is a graph showing a simulation results of a simulation 2.

FIG. 4 is a graph showing a simulation result of a simulation 2. FIG. 4 is a graph showing a relationship between the distance from the second semiconductor part SP2 and the stress occurring in the silicide layer SiL. A horizontal axis indicates the distance [nm] from the second semiconductor part SP2 in the extending direction of the first semiconductor part SP1. A vertical axis indicates the magnitude of the stress [GPa] without normalization. In the simulation 2, a simulation was performed for the case where the material of the metal was cobalt or nickel. In FIG. 4, the simulation result in the case where the material of the metal is cobalt is indicated by a black circle (•), and the simulation result in the case where the material of the metal is nickel is indicated by a black square (■).

As it is clear from FIG. 4, the same result as the simulation result of the simulation 1 is shown regardless of the material of the metal. That is, when the distance from the second semiconductor part SP2 is about 100 nm or more, the stress is reduced to the same level as the stress when the distance from the second semiconductor part SP2 is 0 nm. On the other hand, as compared with the case where the material of the metal is nickel, when the material of the metal is cobalt, the stress is greater. That is, when the metal material is cobalt, it is effective the semiconductor layer SL is formed such that the distance between the PN junction surface PNS and the second semiconductor part SP2 is about 100 nm or more, as compared with the case where the metal material is nickel.

[Simulation 3]

As described above, it is preferable that the PN junction is formed only of the first low-concentration region LCR1 and the second low-concentration region LCR2 and is not formed of the first high-concentration region HCR1 and the second high-concentration region HCR2 from the viewpoint of reducing the stress generated in the PN junction surface PNS as compared with the case where the PN junction is formed only of the first high-concentration region HCR1 and the second high-concentration region HCR2 Here, a simulation was performed to investigate the distance between the first high-concentration region HCR1 and the second high-concentration region HCR2 for the PN junction being formed of only the first low-concentration region LCR1 and the second low-concentration region LCR2 Here, the distance between the first high-concentration region HCR1 and the second high-concentration region HCR2 is a distance between the first high-concentration region HCR1 and the second high-concentration region HCR2 in a direction along the main surface of the semiconductor substrate SUB.

Figure 5:
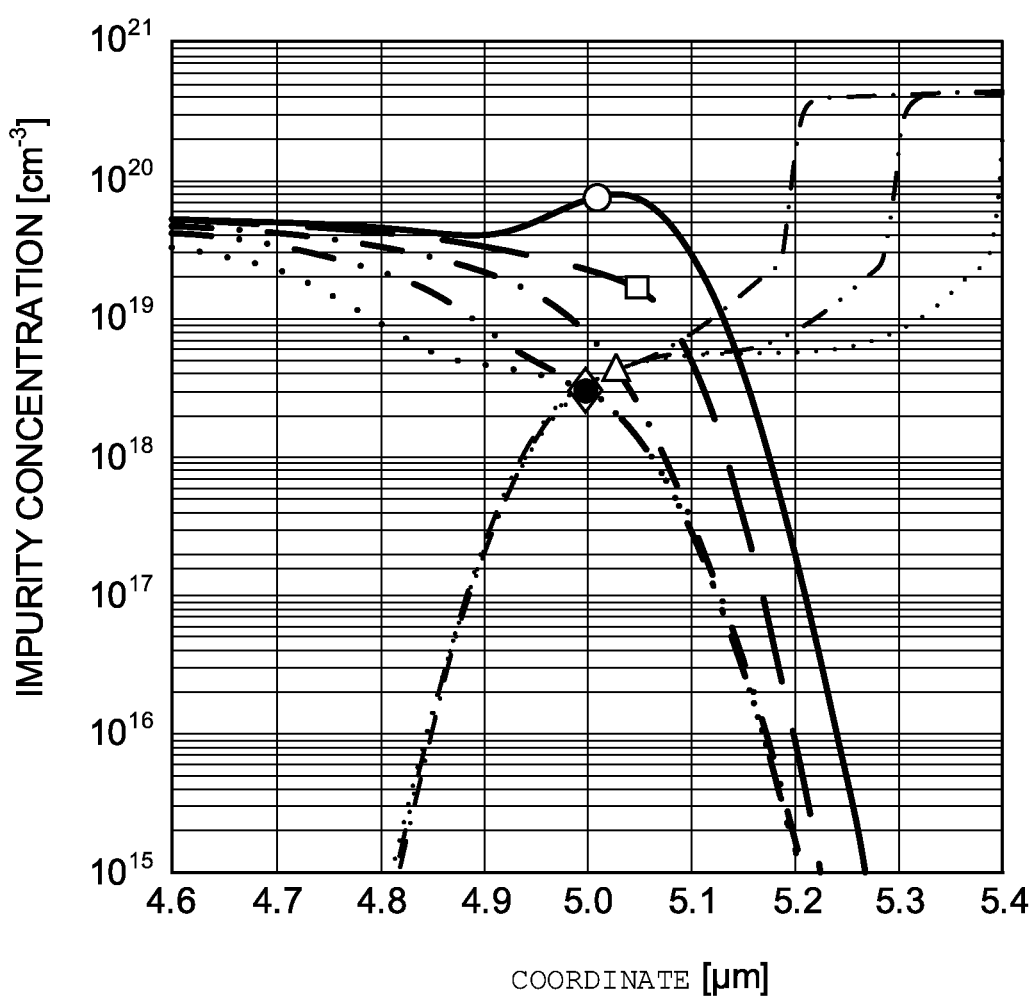
FIG. 5 is a graph showing a simulation results of a simulation 3.

FIG. 5 is a graph showing a simulation result of the simulation 3. FIG. 5 is a graph showing a relationship between the coordinate [μm] indicating a location in the semiconductor layer SL and an impurity concentration [cm$^{-3}$] of an impurity contained in the semiconductor layer SL. In the simulation 3, a simulation was performed when the distance between the first high-concentration region HCR1 and the second high-concentration region HCR2 was 0.0 μm, 0.2 μm, 0.4 μm, 0.6 μm, or 0.8 μm, respectively. When the distance is 0 μm, the semiconductor layer SL does not include the first low-concentration region LCR1 and the second low-concentration region LCR2.

Further, in the simulation 3, the first conductivity type is N-type, and a N-type impurity is phosphorus. The second conductivity type is P-type, and a P-type impurity is boron. In FIG. 5, the coordinate indicating the location of the first high-concentration region HCR1 is smaller than the coordinate indicating the location of the second high-concentration region HCR2.

In FIG. 5, the impurity concentration of the impurity having the first conductivity type is indicated by a thick line, and the impurity concentration of the impurity having the second conductivity type is indicated by a thin line. In addition, when the distance is 0.0 μm, an distribution of the impurity concentration is indicated by a solid line, and the location of the PN junction is indicated as white circles (○) If the distance is 0.2 μm, the distribution of the impurity concentration is indicated by a dashed line and the location of the PN junction is indicated in white squares (□). If the distance is 0.4 μm, the distribution of the impurity concentration is indicated by a dash-dot line, and the location of the PN junction is indicated by white triangles (Δ). When the distance is 0.6 μm, the distribution of the impurity concentration is indicated by a double-dotted dashed line, and the location of the PN junction is indicated by white diamonds (◇). If the distance is 0.8 μm, the distribution of the impurity concentration is indicated by a dotted line and the location of the PN junction is indicated by solid circles. The location of the PN junction is a location where the impurity concentration of the impurity having the first conductivity type and the impurity concentration of the impurity having the second conductivity type are equal to each other.

As is clear from FIG. 5, when the distance is 0.0 μm (0), 0.2 μm (□) and 0.4 μm (Δ), the location of the PN junction fluctuates. On the other hand, in the case where the distance is 0.6 μm (○) and 0.8 μm (x), the location of the PN junction is substantially constant. This indicates that, if the distance is 0.6 μm or more, the PN junction is formed only of the first low-concentration region LCR1 and the second low-concentration region LCR2, and is not affected from the first high-concentration region HCR1 and the second high-concentration region HCR2 From the result of the simulation 3, it is understood that the distance is preferably 0.6 μm or more.

[Method of Manufacturing Semiconductor Device]

FIGS. 6A to 15C are cross-sectional views illustrating exemplary steps included in a method of manufacturing the semiconductor device SD according to present embodiment. FIG. 6A, FIG. 7A, FIG. 8A, FIG. 9A, FIG. 10A, FIG. 11A, FIG. 12A, FIG. 13A, FIG. 14A, and FIG. 15A are cross-sectional views at a location corresponding to FIG. 2A. FIG. 6B, FIG. 7B, FIG. 8B, FIG. 9B, FIG. 10B, FIG. 11B, FIG. 12B, FIG. 13B, FIG. 14B and FIG. 15B are cross-sectional views at location corresponding to FIG. 2B. FIG. 6C, FIG. 7C, FIG. 8C, FIG. 9C, FIG. 10C, FIG. 11C, FIG. 12C, FIG. 13C, FIG. 14C and FIG. 15C are cross-sectional views at location corresponding to FIG. 2C.

The method of manufacturing the semiconductor device SD according to present embodiment includes (1) providing a semiconductor wafer SW, (2) forming the insulating layer IL, (3) forming the polycrystalline silicon layer PSL, (4) first ion implantation, (5) second ion implantation, (6) forming the sidewall, (7) third ion implantation, (8) fourth ion implantation, (9) silicidation, and (10) forming the multilayer wiring layer MWL.

(1) Providing a Semiconductor Wafer SW

Figure 6A:
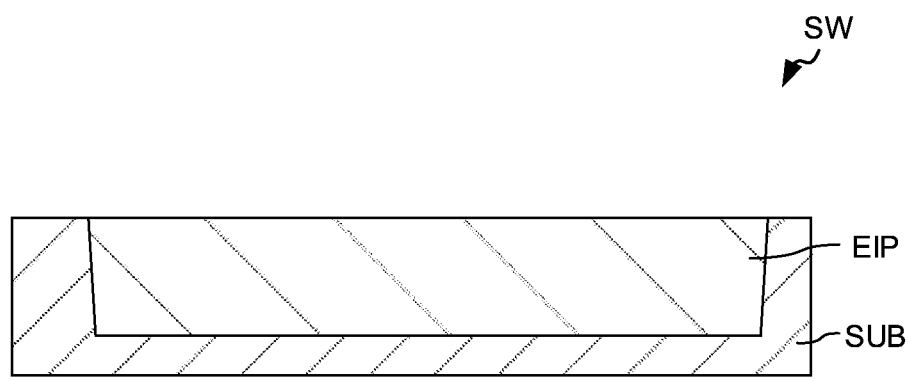
FIGS. 6A to 6C are cross-sectional views illustrating exemplary steps included in a method of manufacturing the semiconductor device according to the embodiment.
Figure 6B:
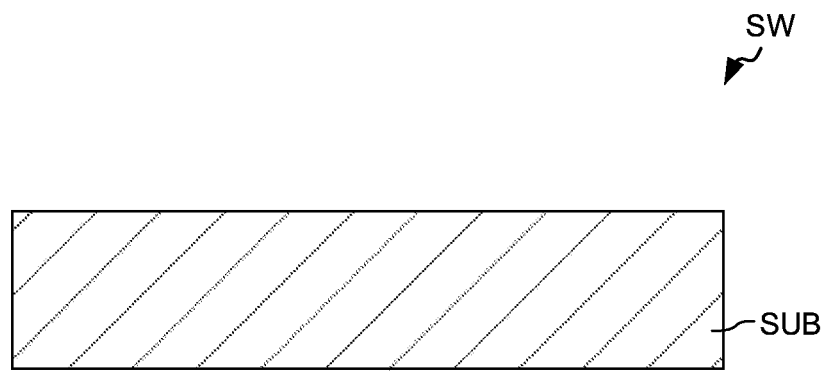
Figure 6C:
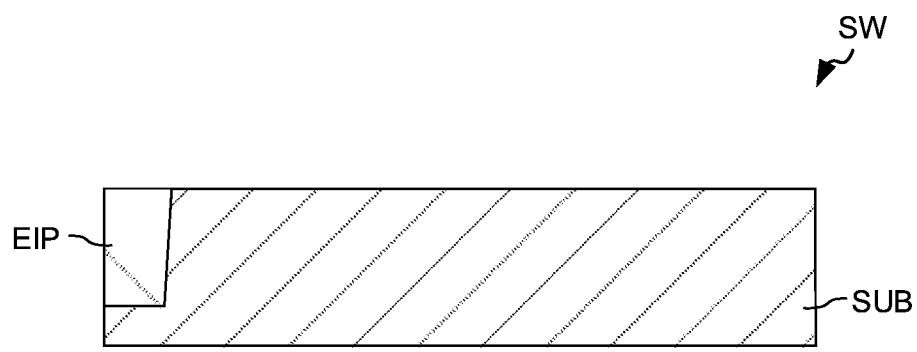

As shown in FIGS. 6A to 6C of a semiconductor wafer SW is provided. The semiconductor wafer SW may be purchased or manufactured as an off-the-shelf product. The provided semiconductor wafer SW is held on an electrostatic chuck.

For example, the element isolation portion EIP is formed on a main surface of the semiconductor wafer SW. The element isolation portion EIP may be formed by forming a recess on the main surface of the semiconductor wafer SW by etching method, and then burying an insulating film in the recess. The element isolation portion EIP be formed by oxidizing a part of the main surface of the semiconductor wafer SW by LOCOS method.

Further, the semiconductor wafer SW includes the first region R1 including an impurity of the first conductivity type, and the second region R2 including an impurity of the second conductivity type. The first region R1 and the second region R2 are formed, for example, by introducing a predetermined impurity into the semiconductor wafer SW by ion implantation and then performing activation annealing.

(2) Forming the Insulating Layer IL

Figure 7A:
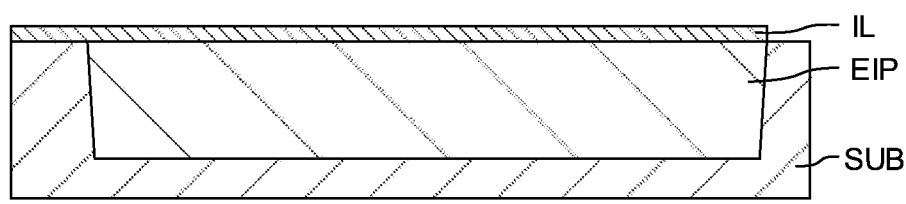
FIGS. 7A to 7C are cross-sectional views illustrating exemplary steps included in the method of manufacturing the semiconductor device according to the embodiment.
Figure 7B:
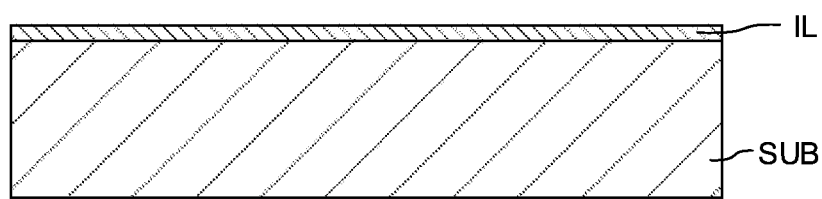
Figure 7C:
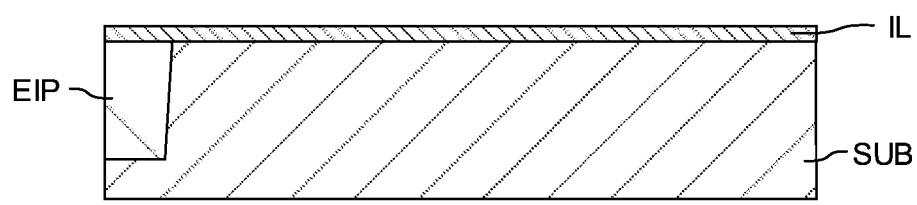

As shown in FIGS. 7A to 7C, the insulating layer IL is formed on the main surface of the semiconductor substrate SUB and on the element isolation portion EIP. A part of the insulating layer IL is the gate dielectric film GI1, GI2. An example of method of forming the insulating layer IL include CVD method and thermal oxidization method. In this step, the insulating layer IL may be patterned into a desired shape by an etching method.

(3) Forming the Polycrystalline Silicon Layer PSL

Figure 8A:
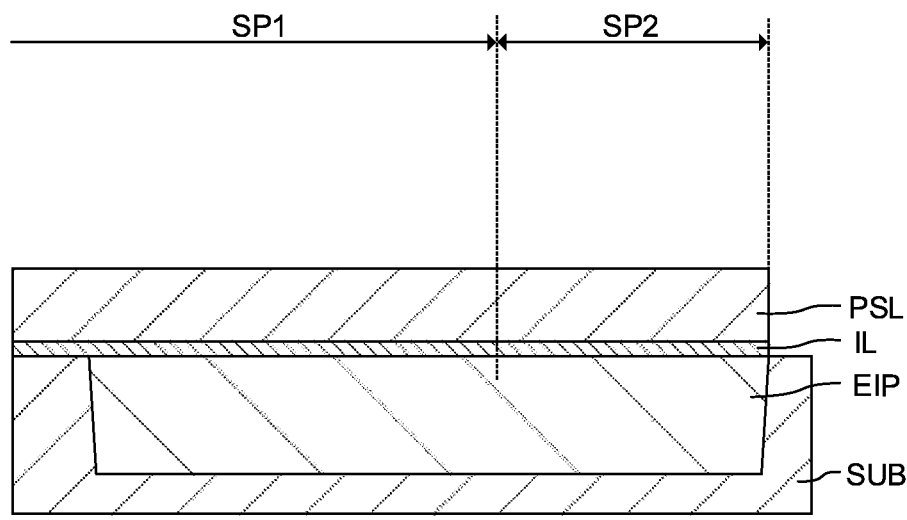
FIGS. 8A to 8C are cross-sectional views illustrating exemplary steps included in the method of manufacturing the semiconductor device according to the embodiment.
Figure 8B:
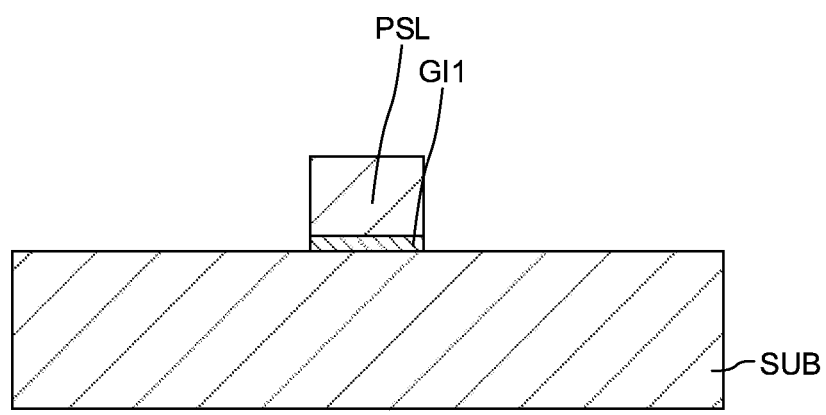
Figure 8C:
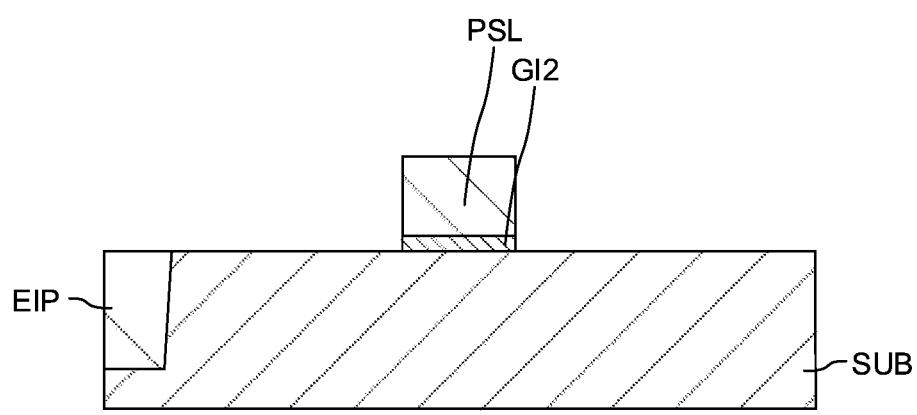

As shown in the FIGS. 8A to 8C, the polycrystalline silicon layer PSL is formed on the insulating layer IL. The polycrystalline silicon layer PSL, for example, is formed by forming a film including a polycrystalline silicon by CVD method, and then, patterning the film by an etching method. In present embodiment, the insulating layer IL is also patterned in this step. The polycrystalline silicon layer PSL, in a predetermined direction, has a first semiconductor part SP1 having a width of the first length L1, a second semiconductor part SP2 having a width of the second length L2, and a third semiconductor part SP3 having a width of the third length L3 (the first length L1, the second length L2 and the third length L3, refer to FIG. 1).

(4) First Ion Implantation

Figure 9A:
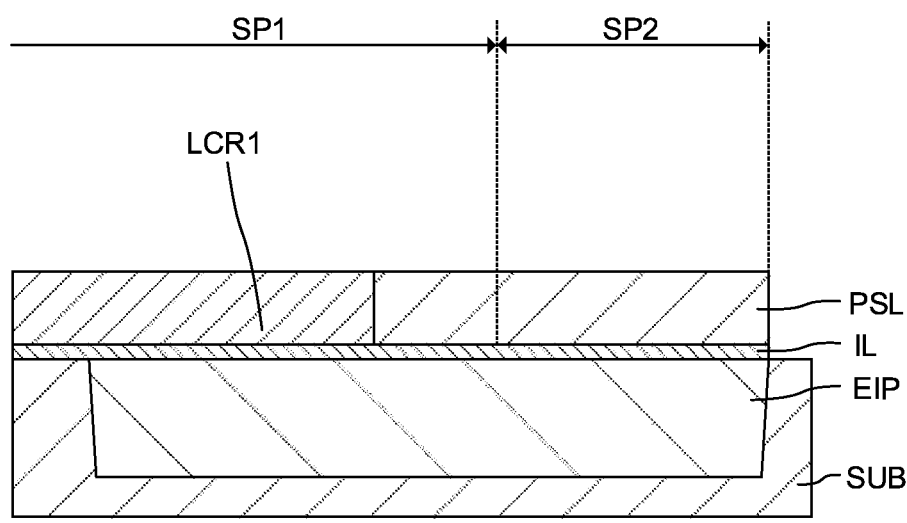
FIGS. 9A to 9C are cross-sectional views illustrating exemplary steps included in the method of manufacturing the semiconductor device according to the embodiment.
Figure 9B:
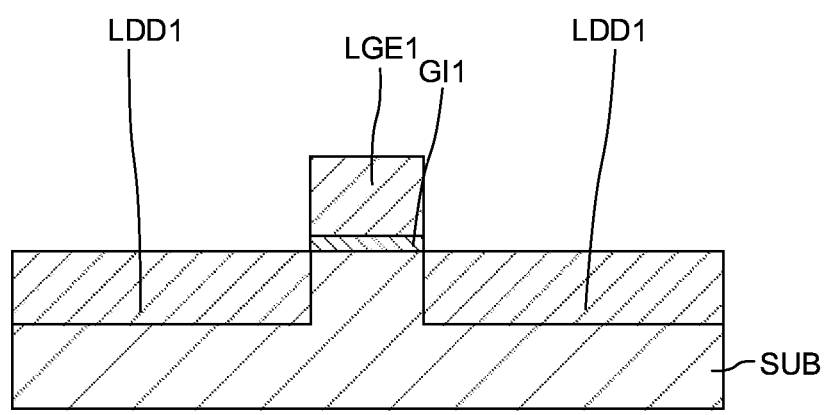
Figure 9C:
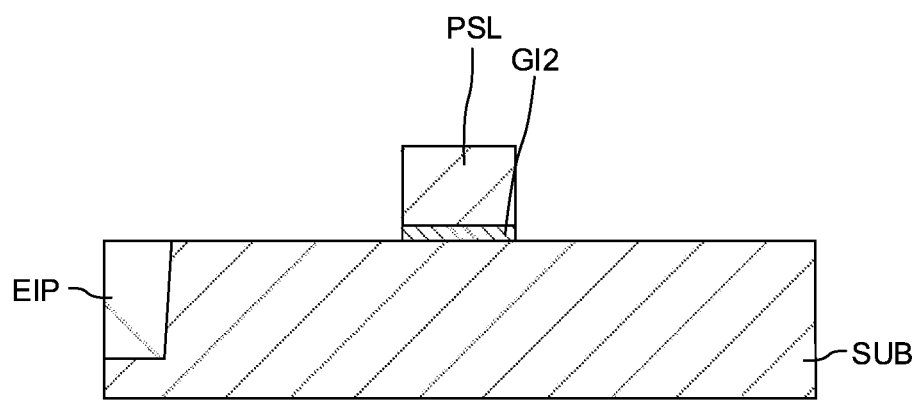

As shown in FIGS. 9A to 9C, the impurity of the first conductivity type is implanted into a part of the polycrystalline silicon layer PSL and a part of the semiconductor substrate SUB to form a low-concentration region of the first conductivity type. Specifically, by the ion implantation method, the impurity of the first conductivity type is implanted to a part of the first semiconductor part SP1, of the polycrystalline silicon layer PSL. As a result, the first low-concentration region LCR1 and the low-concentration gate electrode LGE1 are formed. The impurity of the first conductivity type is introduced into parts, of semiconductor substrate SUB, located on both sides of the low-concentration gate electrodes LGE1 by ion implantation method. As a result, the extension region LDD1 is formed.

(5) Second Ion Implantation

Figure 10A:
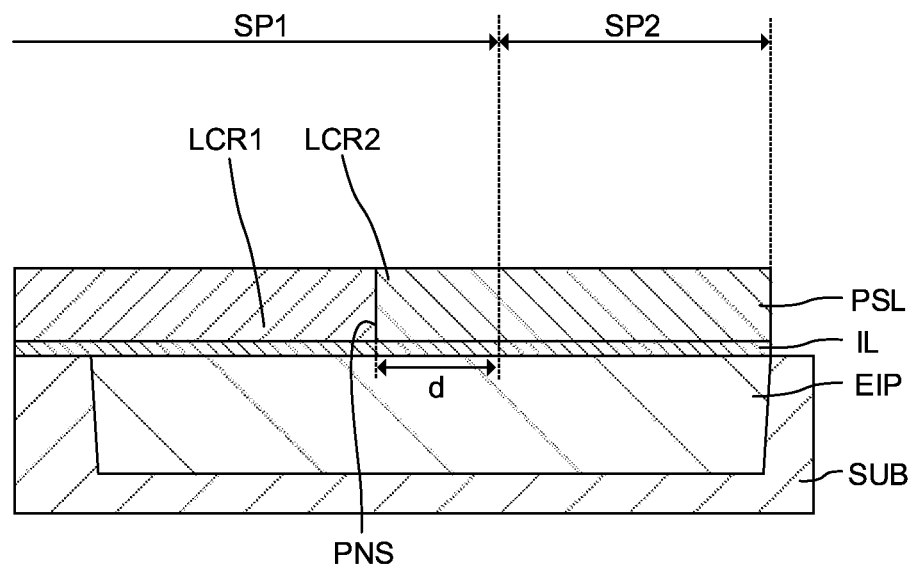
FIGS. 10A to 10C are cross-sectional views illustrating exemplary steps included in the method of manufacturing the semiconductor device according to the embodiment.
Figure 10B:
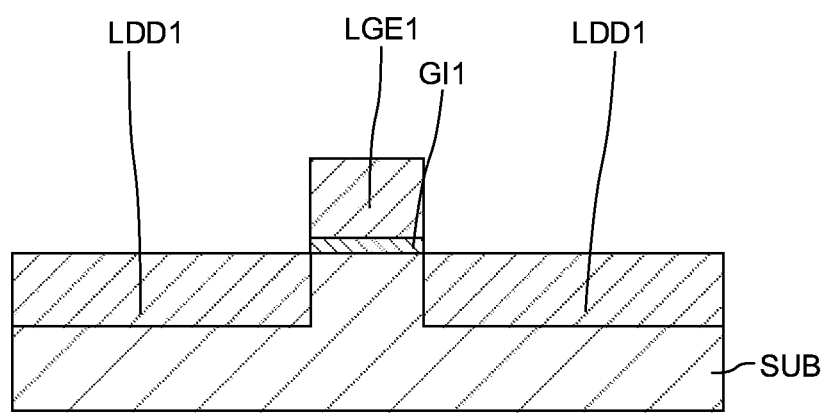
Figure 10C:
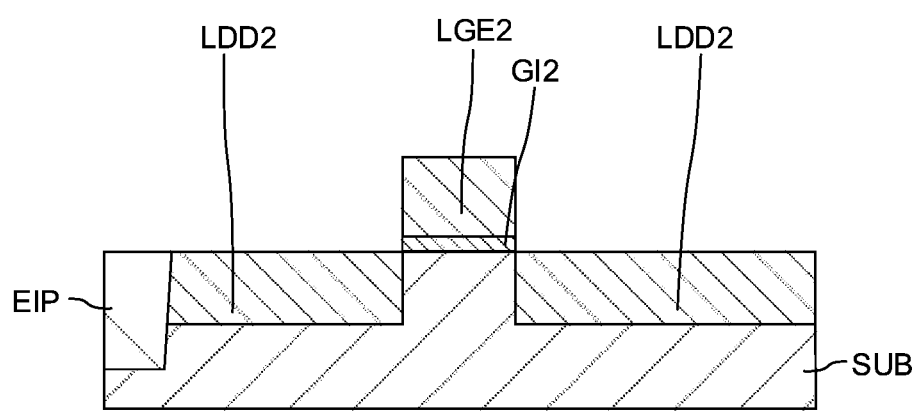

As shown in FIGS. 10A to 10C, the impurity of the second conductivity type is implanted into another part of the polycrystalline silicon layer PSL and another part of semiconductor substrate SUB to form a low-concentration region of the second conductivity type. Specifically, of the polycrystalline silicon layer PSL, the impurity of the second conductivity type is introduced into another part of the first semiconductor part SP1, the second semiconductor part SP2, and third semiconductor part SP3 by the ion implantation method. As a result, second low-concentration region LCR2 and the low-concentration gate electrode LGE2 are formed. The impurity of the second conductivity type is introduced into parts located on both sides of the low-concentration gate electrode LGE2 by ion implantation method, of another part of the semiconductor substrate SUB. As a result, the extension region LDD2 is formed. Further, by this step, the PN junction surface PNS which is an interface of the first low-concentration region LCR1 and the second low-concentration region LCR2 is formed.

(6) Forming Sidewalls

Figure 11A:
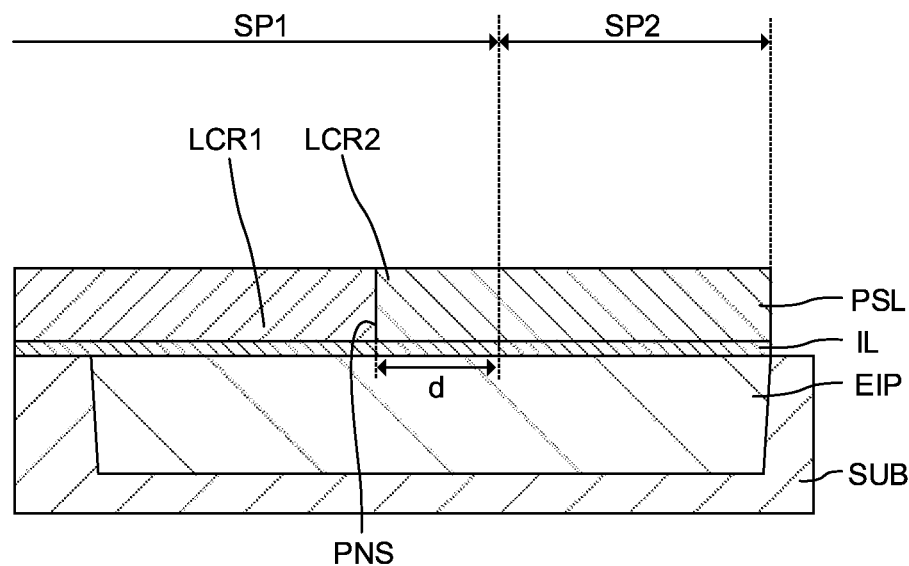
FIGS. 11A to 11C are cross-sectional views illustrating exemplary steps included in the method of manufacturing the semiconductor device according to the embodiment.
Figure 11B:
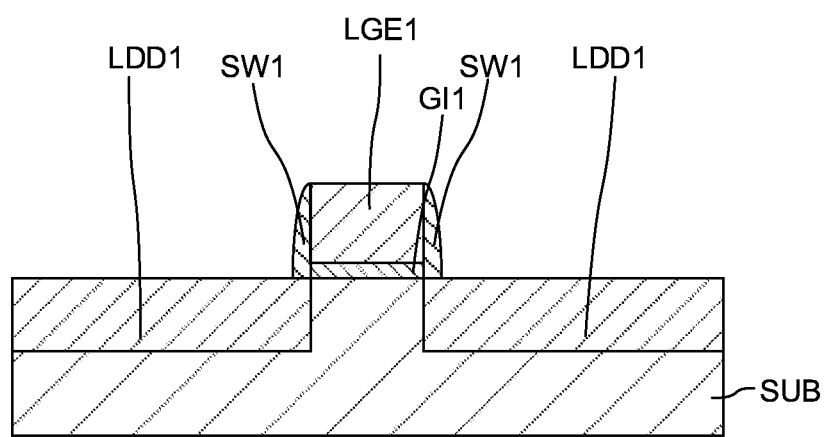
Figure 11C:
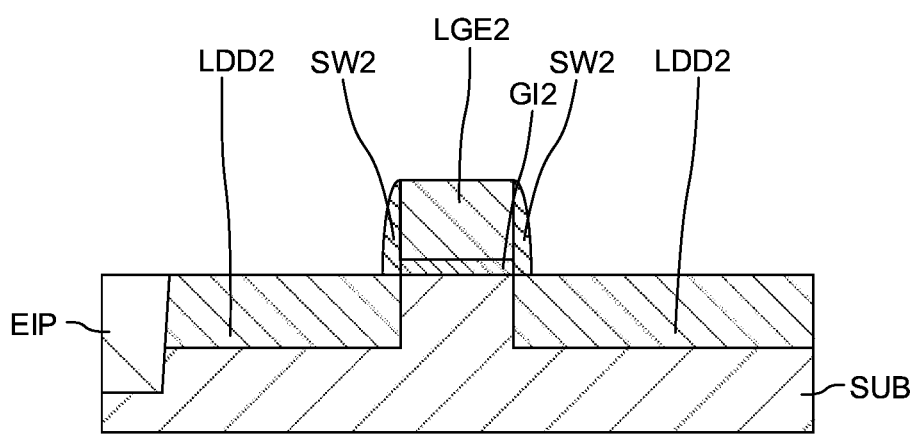

As shown in FIGS. 11A to 11C, the sidewall SW1, SW2 is formed on both sides of a part of the polycrystalline silicon layer PSL on the semiconductor substrate SUB. More specifically, the sidewall SW2 is formed on both sides of the low-concentration gate electrode LGE2, and the sidewall SW1 is formed on both sides of the low-concentration gate electrode LGE1. The sidewall SW1, SW2 is formed by a method known in semiconductor technology.

(7) Third Ion Implantation

Figure 12A:
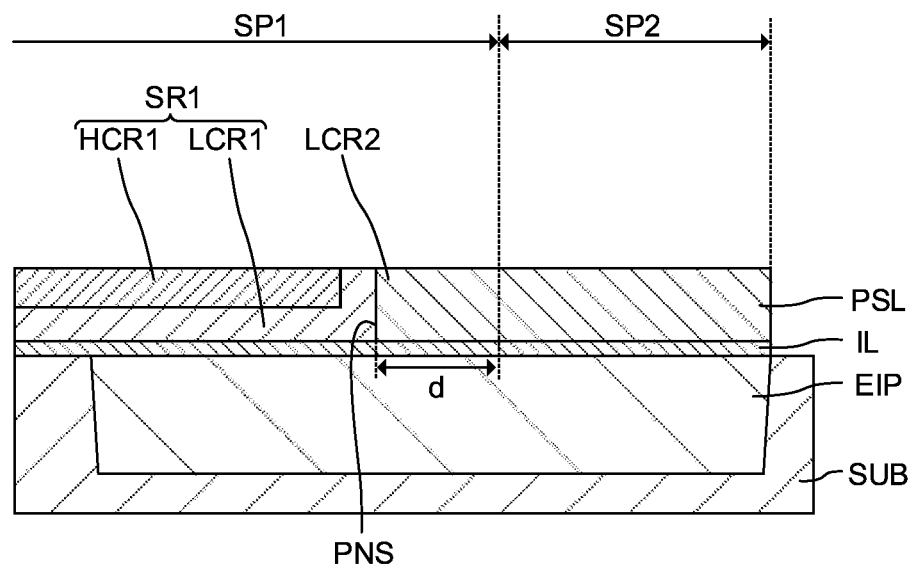
FIGS. 12A to 12C are cross-sectional views illustrating exemplary steps included in the method of manufacturing the semiconductor device according to the embodiment.
Figure 12B:
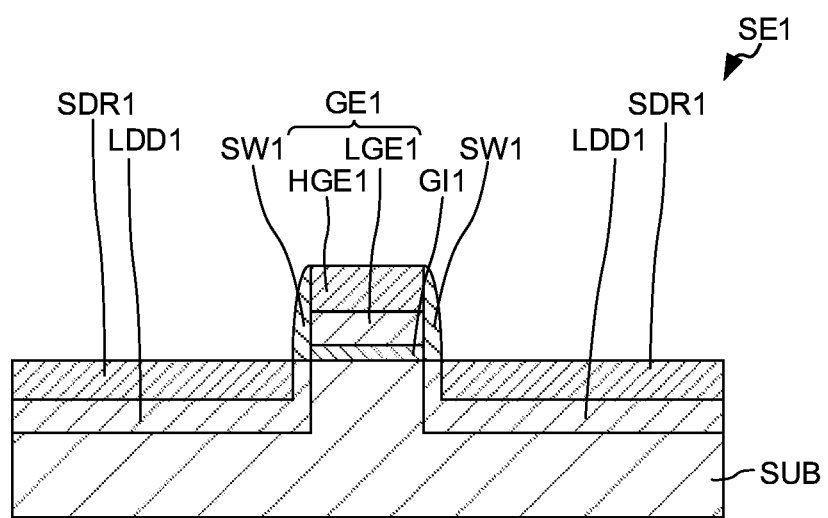
Figure 12C:
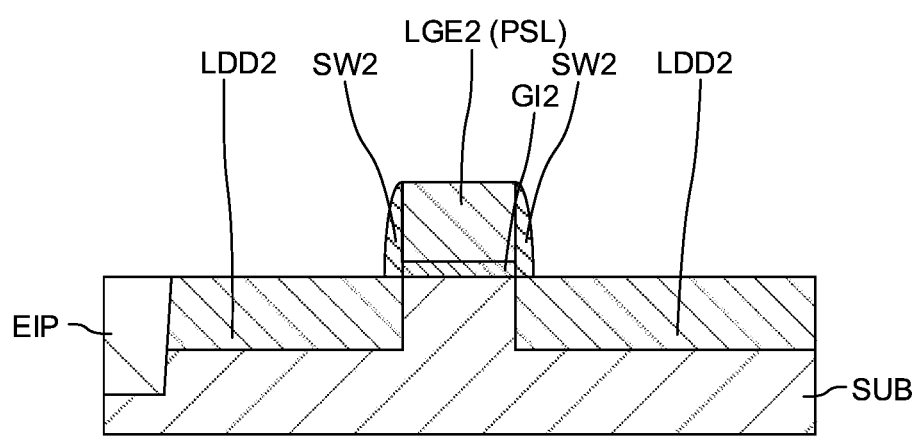

As shown in FIGS. 12A to 12C, the impurity of the first conductivity type is implanted into a part of the polycrystalline silicon layer PSL and a part of the semiconductor substrate SUB to form a first conductivity type high-concentration region. More specifically, the impurity of the first conductivity type is introduced into a part of the first semiconductor part SP1 (the first low-concentration region LCR1 and the low-concentration gate electrodes LGE1) of the polycrystalline silicon layer PSL by ion implantation method. As a result, the first high-concentration region HCR1 and the high-concentration gate electrodes HGE1 are formed. Also, by ion implantation method, the impurity of the first conductivity type is introduced to the parts located on both sides of the sidewall SW1, of a part of the semiconductor substrate SUB (the extension region LDD1). Thus, source/drain region SDR1 is formed. Consequently, the first semiconductor element SE1 is formed.

(8) Fourth Ion Implantation

Figure 13A:
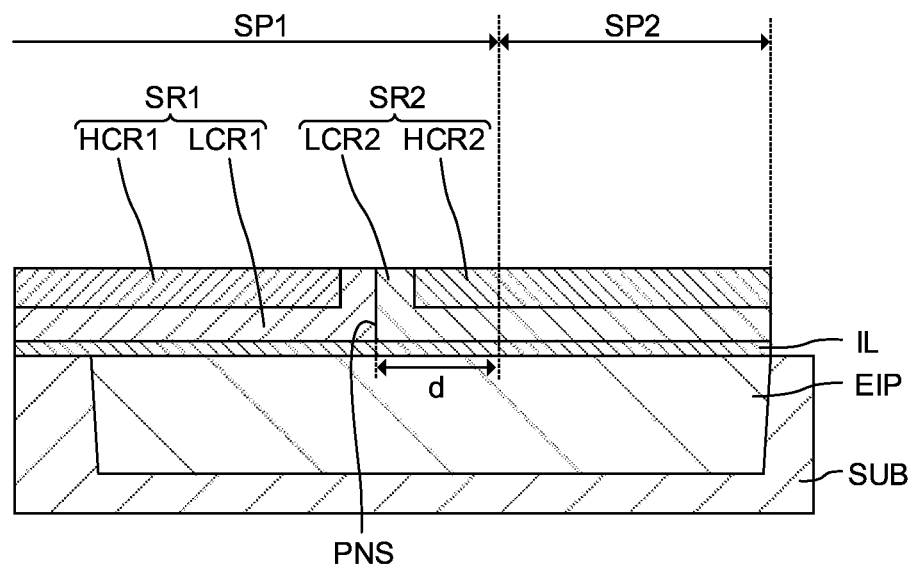
FIGS. 13A to 13C are cross-sectional views illustrating exemplary steps included in the method of manufacturing the semiconductor device according to the embodiment.
Figure 13B:
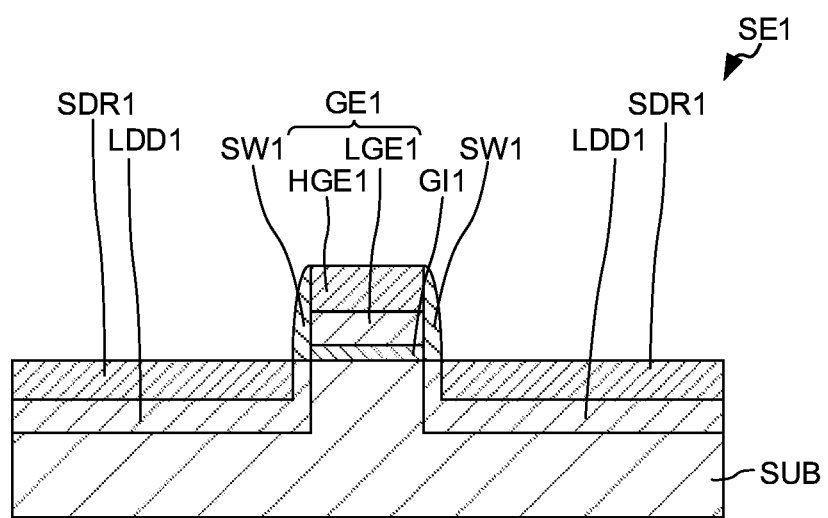
Figure 13C:
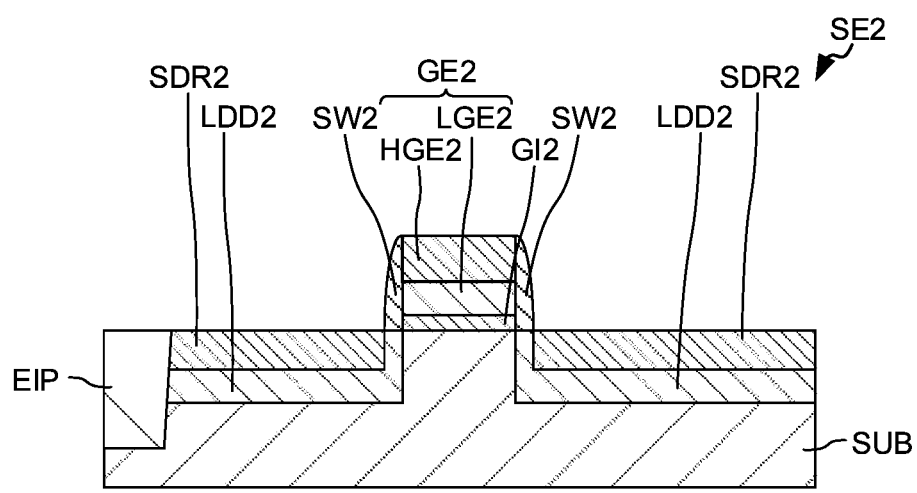

As shown in FIGS. 13A to 13C, the impurity of the second conductivity type is implanted into a part of the polycrystalline silicon layer PSL and a part of the semiconductor substrate SUB to form a second conductivity type high-concentration region. Specifically, by ion implantation method, the impurity of the second conductivity type is introduced into a part of the first semiconductor part SP1 (the second low concentration region LCR2 and the low concentration gate electrode LGE2), the second semiconductor part SP2, and the third semiconductor part SP3, of the polycrystalline silicon layer PSL. As a result, the second high-concentration region HCR2 and the high-concentration gate electrode HGE2 are formed. In addition, by the ion-implantation method, the impurity of the second conductivity type is introduced into parts located on both sides of the sidewall SW2, of a part of the semiconductor substrate SUB. Thus, the source/drain region SDR2 is formed. As a consequence, the second semiconductor element SE2 is formed.

Further, by this step, the semiconductor layer SL including the first semiconductor part SP1, the second semiconductor part SP2 and the third semiconductor part SP3 is formed. After ion implantation, it is preferable to activate the impurity by annealing the semiconductor substrate SUB and the semiconductor layer SL.

(9) Silicidation

Figure 14A:
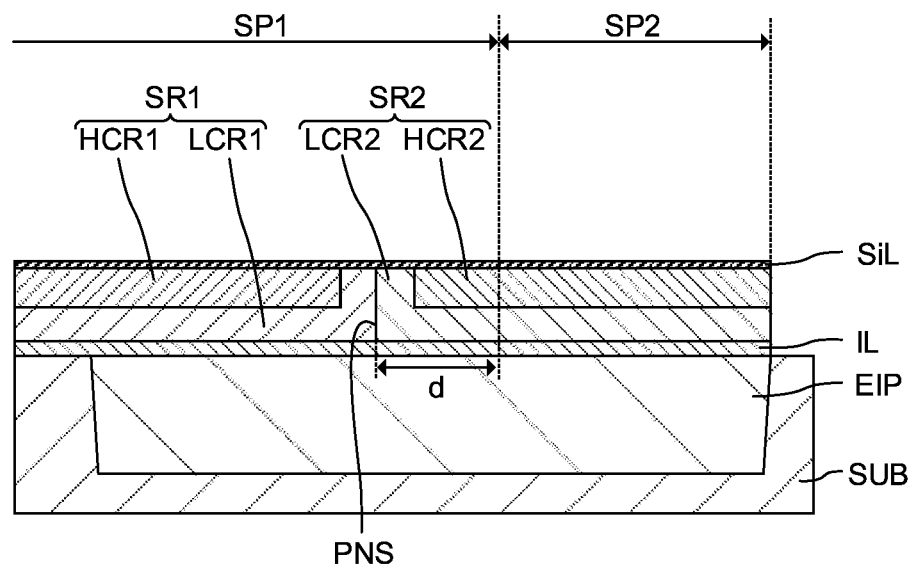
FIGS. 14A to 14C are cross-sectional views illustrating exemplary steps included in the method of manufacturing the semiconductor device according to the embodiment.
Figure 14B:
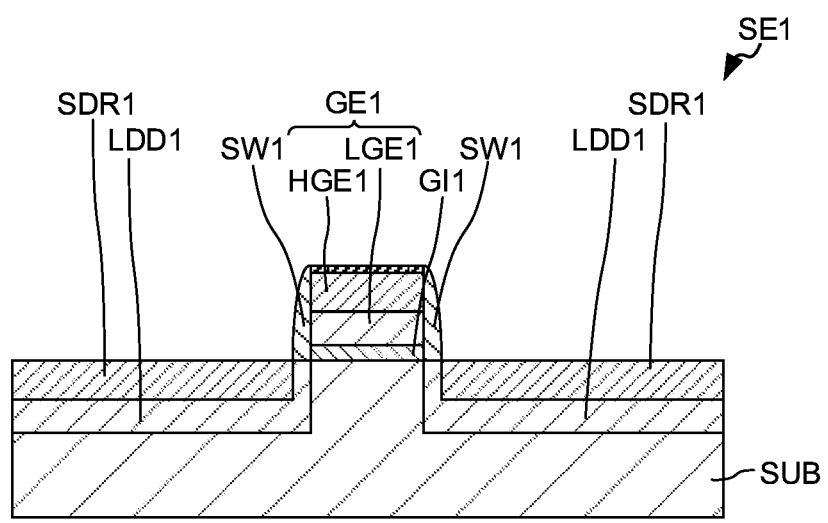
Figure 14C:
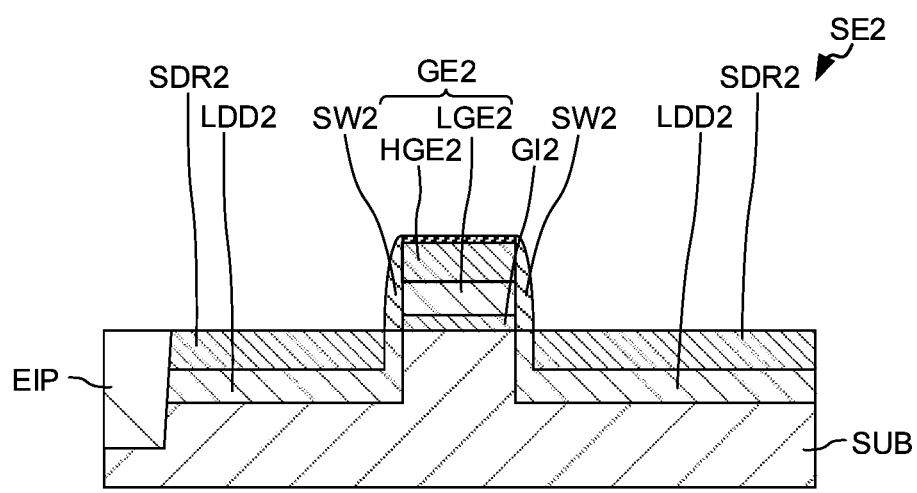

Subsequently, as shown in FIGS. 14A to 14C, the silicide layer SiL is formed on the upper surface of the semiconductor layer SL. More specifically, the silicide layer SiL is formed on an upper surface of the first high-concentration region HCR1, an upper surface of the first low-concentration region LCR1, an upper surface of the second high-concentration region HCR2, an upper surface of the second low-concentration region LCR2, an upper surface of the high-concentration gate electrode HGE1, and an upper surface of the high-concentration gate electrode HGE2. A method of forming the silicide layer SiL is not particularly limited. The silicide layer SiL, for example, is formed by forming a metal layer on the semiconductor substrate SUB so as to cover the semiconductor layer SL, and then, performing an annealing treatment. The silicide layer SiL may be formed on an upper surface of the source/drain region SDR1, SDR2.

(10) Forming the Multilayer Wiring Layer MWL

Figure 15A:
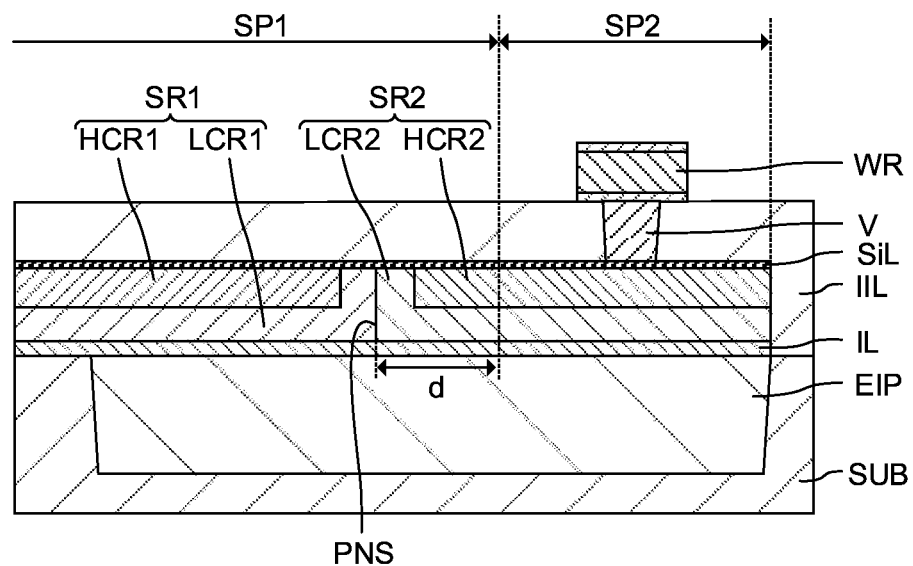
FIGS. 15A to 15C are cross-sectional views illustrating exemplary steps included in the method of manufacturing the semiconductor device according to the embodiment.
Figure 15B:
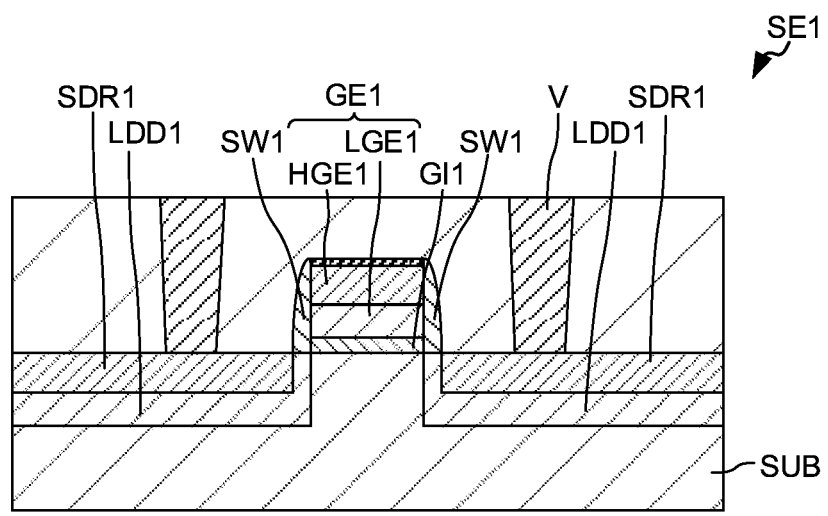
Figure 15C:
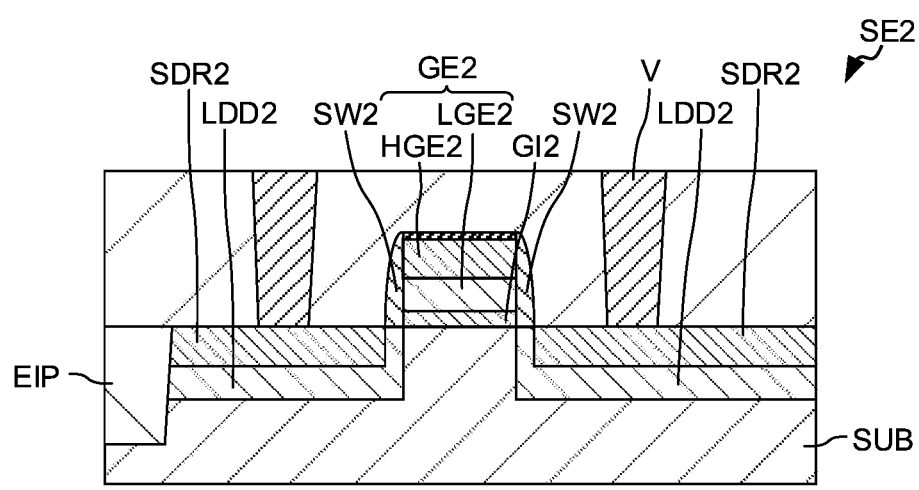

As shown in FIGS. 15A to 15C, the multilayer wiring layer MWL is formed so as to cover the semiconductor layer SL. The multilayer wiring layer MWL includes the interlayer insulating layer IIL, the via V, the wiring WR, the power supply wiring VDD and the ground wiring GND.

The interlayer insulating layer IIL is formed by, for example, CVD method. The via V is formed by forming a through hole in the interlayer insulating layer IIL, and then burying a conductive material in the through hole. The wiring WR, the power supply wiring VDD and the ground wiring GND are formed by forming a conductive layer by a sputtering method, and then patterning the conductive layer to the desired shape.

Finally, the structures obtained by the above steps are detached from the electrostatic chuck and diced to obtain a plurality of singulated semiconductor device SD.

The semiconductor device SD according to present embodiment is manufactured by the above manufacturing method. The method of manufacturing the semiconductor device SD according to present embodiment may further include another step as required, and is not limited to the above-mentioned order of steps. For example, the first ion implantation may be performed after the second ion implantation, and the third ion implantation may be performed after the fourth ion implantation. Further, the first low-concentration region LCR1 is formed by an ion implantation method (the first ion implantation), but may be formed by forming the first high-concentration region HCR1, and then performing an annealing treatment. By the annealing treatment, the impurity included in the first high-concentration region HCR1 diffuse, and the first low-concentration region LCR1 can be formed. The second low-concentration region LCR2 and the extension region LDD1, LDD2 are the same as the first low-concentration region LCR1.

(Effect)

In the semiconductor device SD according to present embodiment, the distance between the first semiconductor region SR1 (the first low-concentration region LCR1) and the second semiconductor part SP2 in the extension direction in which the first semiconductor part SP1 extends is 100 nm or more. Thus, of the silicide layer SiL, a part located in the vicinity of the PN junction surface PNS can be suppressed from being subjected to stress caused by the second semiconductor part SP2. As a result, the occurrence of defects in the silicide layer SiL is suppressed. When the semiconductor layer SL is a gate wiring, the function of the semiconductor layer SL as a gate wiring is maintained. Therefore, according to present embodiment, it is possible to improve the reliability of the semiconductor device SD.

Figure 16:
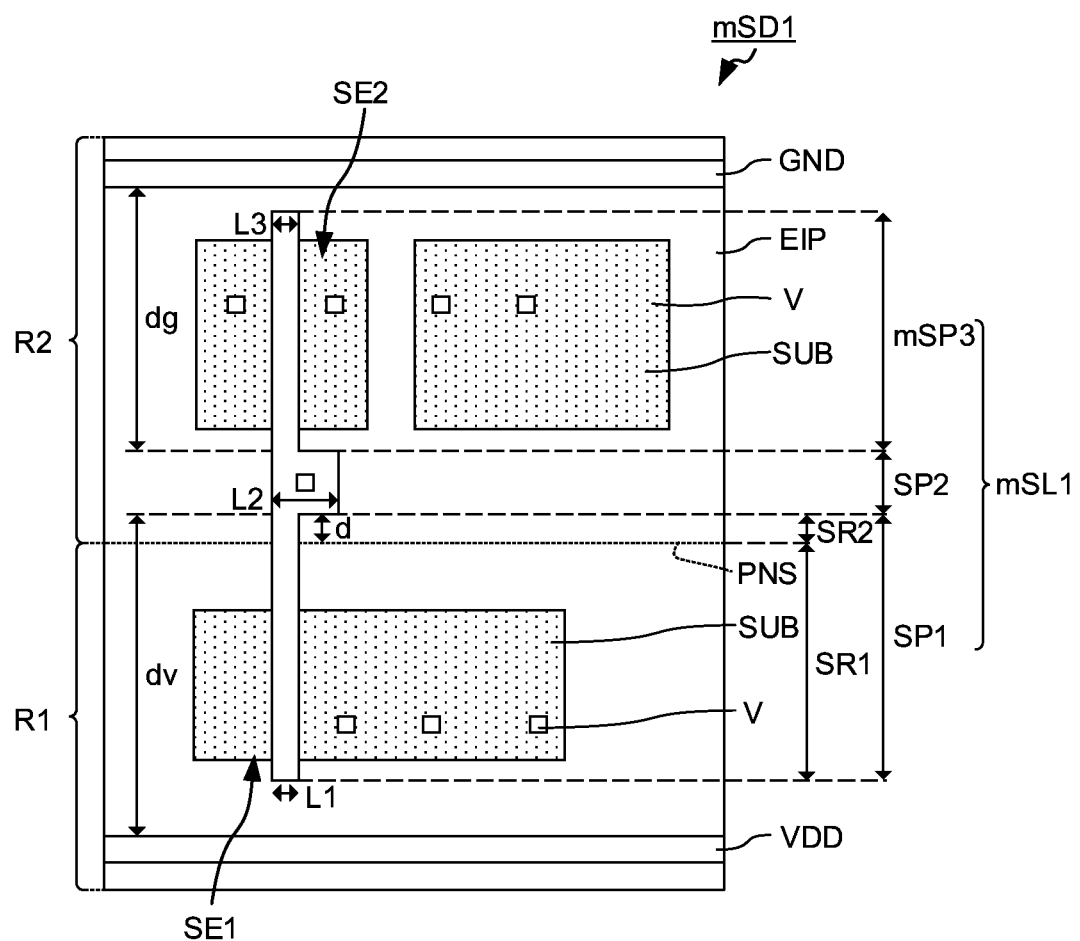
FIG. 16 is a plan view illustrating an exemplary configuration of main portion of a semiconductor device according to a first modification of the embodiment.

FIG. 16 is a plan view illustrating an exemplary configuration of a main portion in a semiconductor device mSD1 according to first modification of present embodiment. As shown in FIG. 16, a semiconductor layer mSL1 of the semiconductor device mSD1 includes the first semiconductor part SP1, the second semiconductor part SP2 and a third semiconductor part mSP3. The third semiconductor part mSP3, in plan view, is located on the extension line of the first semiconductor part SP1. Thus, as compared with the case where the third semiconductor part mSP3 is located on the extension line of the first semiconductor part SP1, the size of the second semiconductor part SP2 is reduced. As a result, the stress generated in the vicinity of the PN junction surface PNS are reduced, and the reliability of the semiconductor device mSD1 can be further enhanced.

Figure 17:
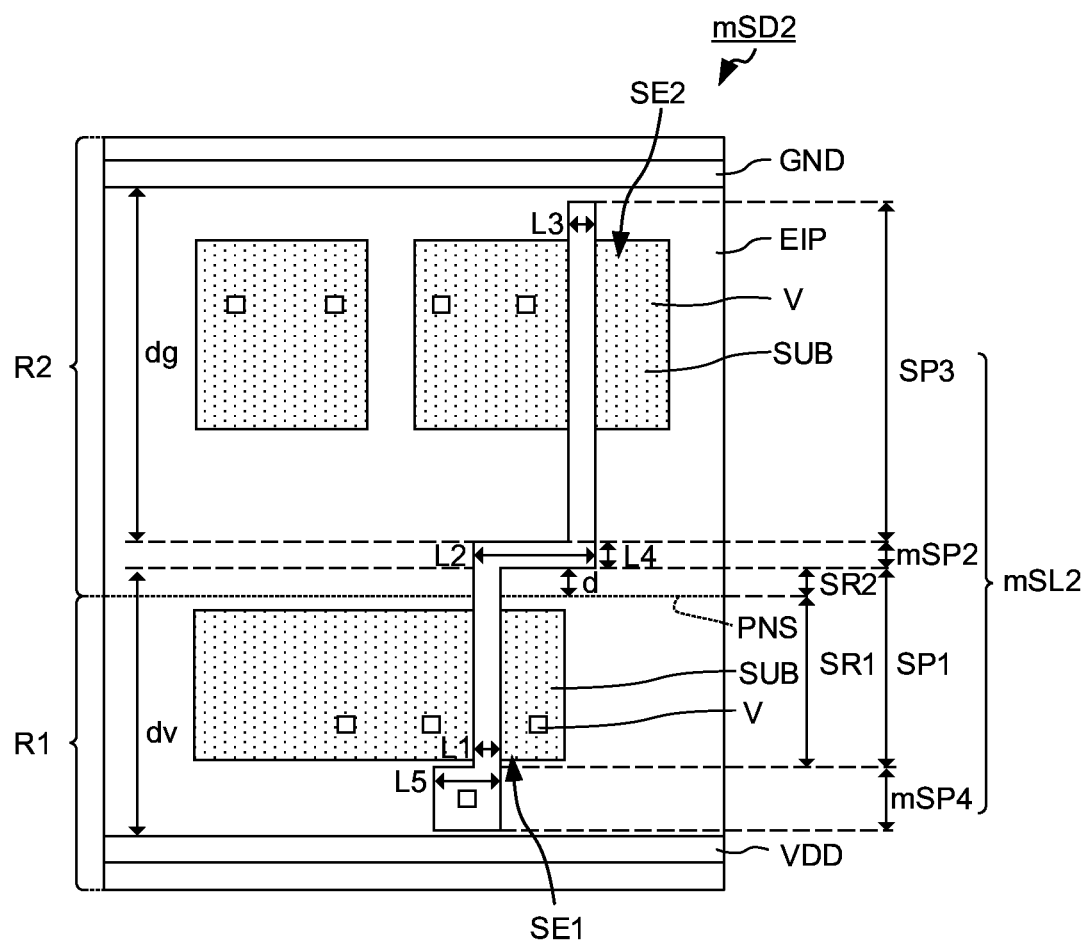
FIG. 17 is a plan view illustrating an exemplary configuration of a main portion of a semiconductor device according to a second modification of the present embodiment.

FIG. 17 is a plan view illustrating an exemplary configuration of a main portion of a semiconductor device mSD2 according to a second modification of present embodiment. As shown in FIG. 17, a semiconductor layer mSL2 of the semiconductor device mSD2 includes the first semiconductor part SP1, a second semiconductor part mSP2, the third semiconductor part SP3 and the fourth semiconductor part mSP4. In the second modification, the via V is not formed on the second semiconductor part mSP2. In the extending direction of the first semiconductor part SP1, it is possible to reduce a fourth length L4 of the second semiconductor part mSP2. Thus, it is possible to place another semiconductor layer in the vicinity of the semiconductor layer mSL2. That is, it is possible to increase the degree of freedom in design. In the second modification, the fourth length L4 is similar to the first length L1 of the first semiconductor part SP1.

The fourth semiconductor part mSP4 is adjacent the first semiconductor region SR1 of the first semiconductor part SP1. The fourth semiconductor part mSP4 is formed on the first region R1 of the semiconductor substrate SUB. The fourth semiconductor part mSP4 has the first conductivity type. Since a configuration of the fourth semiconductor part mSP4 is the same as the first semiconductor region SR1 of the first semiconductor part SP1, a description thereof will be omitted.

The fourth semiconductor part mSP4 has a fifth length L5 in the width direction of the first semiconductor part SP1. The fifth length L5 is greater than the first length L1. Thus, as compared with the case where the via V is formed on the first semiconductor part SP1, it is possible to reduce the effect of positional deviation due to manufacturing errors.

The fifth length L5 may be greater than the diameter of the via V. The fifth length L5 is preferably, for example, 150 nm or more.

In the second modification, the gate electrode GE1 of the first semiconductor element SE1 is formed between a fourth semiconductor part mSP4 connected with the via V and the gate electrode GE2 of the second semiconductor element. As described above, in plan view, as an area of the semiconductor layer SL increases, the stress generated in the semiconductor layer SL increases. In the second modification, the distance between the fourth semiconductor part mSP4 and the PN junction surface PNS having larger area is large. Thus, the stress caused by the fourth semiconductor part mSP4, it is possible to suppress the generation of defects caused in the silicide layer SiL. Consequently, the reliability of the semiconductor device mSD2 can be further enhanced.

It should be noted that the present invention is not limited to the above-mentioned embodiment, and various modifications can be made without departing from the gist thereof. For example, the second semiconductor part SP2 may be located not on the second region R2 of the semiconductor substrate SUB but on the first region R1.

In addition, even when a specific numerical value example is described, it may be a numerical value exceeding the specific numerical value, or may be a numerical value less than the specific numerical value, except when it is theoretically obviously limited to the numerical value. In addition, the component means "B including A as a main component" or the like, and the embodiment including other components is not excluded.

Further, the embodiment and modifications may be arbitrarily combined with each other. That is, the semiconductor device may have both the semiconductor layer SL and the semiconductor layer mSL.

What is claimed is:

1. A semiconductor device comprising:
  a semiconductor substrate;
  an insulating layer formed on a main surface of the semiconductor substrate;
  a semiconductor layer formed on the insulating layer, the semiconductor layer including a polycrystalline silicon; and
  a silicide layer formed on an upper surface of the semiconductor layer,
  wherein the semiconductor layer includes:
    a first semiconductor part including a first semiconductor region of a first conductivity type and a second semiconductor region of a second conductivity type different from the first conductivity type; and
    a second semiconductor part of the second conductivity type, the second semiconductor part adjacent the second semiconductor region,
  wherein the first semiconductor part has a first length in a width direction of the first semiconductor part,
  wherein, in the width direction, the second semiconductor part has a second length greater than the first length, and
  wherein a distance between the first semiconductor region and the second semiconductor part is 100 nm or more in an extending direction in which the first semiconductor part extends.

2. The semiconductor device according to claim 1, comprising:
  an interlayer insulating layer formed on the semiconductor substrate such that the interlayer insulating layer covers the semiconductor layer; and a via formed in the interlayer insulating layer such that the via reaches the second semiconductor part.

3. The semiconductor device according to claim 2, wherein, in the width direction, the second length of the second semiconductor part is 1.5 times or more of the first length.

4. The semiconductor device according to claim 3, wherein the semiconductor layer includes a third semiconductor part adjacent the second semiconductor part, wherein, in the width direction of the first semiconductor part, a third length of the third semiconductor part is smaller than the second length of the second semiconductor part, and wherein the second semiconductor part is formed between the first semiconductor part and the third semiconductor part.

5. The semiconductor device according to claim 4, wherein, in plan view, the third semiconductor part is located on an extension line of the first semiconductor part.

6. The semiconductor device according to claim 4, wherein, in plan view, the third semiconductor part is not located on an extension line of the first semiconductor part.

7. The semiconductor device according to claim 3, wherein the first conductivity type is N-type, and wherein the second conductivity type is P-type.

8. The semiconductor device according to claim 3, wherein the first semiconductor region includes:
a first high-concentration region; and
a first low-concentration region of the first conductivity type, the first low-concentration region having a impurity concentration smaller than an impurity concentration of the first high-concentration region, and
wherein the first low-concentration region is formed between the first high-concentration region and the second semiconductor part.

9. The semiconductor device according to claim 8, wherein the first low-concentration region contacts with a lower surface of the first high-concentration region and a side surface of the first high-concentration region.

10. The semiconductor device according to claim 9, wherein the impurity concentration of the first high-concentration region is $1 \times 10^{19}$ cm$^{-3}$ or more and $1 \times 10^{22}$ cm$^{-3}$ or less, and
wherein the impurity concentration of the first low-concentration region is $1 \times 10^{17}$ cm$^{-3}$ or more and $1 \times 10^{19}$ cm$^{-3}$ or less.

11. The semiconductor device according to claim 8, wherein the second semiconductor region includes:
a second high-concentration region; and
a second low-concentration region of the second conductivity type, the second low-concentration region having an impurity concentration smaller than an impurity concentration of the second high-concentration region, and
wherein the second low-concentration region is formed between the first low-concentration region and the second high-concentration region in the extending direction.

12. The semiconductor device according to claim 3, comprising:
a power supply wiring formed on the interlayer insulating layer, the power supply wiring configured to receive a power supply potential; and
a ground wiring formed on the interlayer insulating layer, the ground wiring configured to receive a ground potential,
wherein, in plan view, the power supply wiring and the ground wiring extend in the width direction of the first semiconductor part.

13. The semiconductor device according to claim 12, wherein, in plan view and in the extending direction, a distance between the power supply wiring and the second semiconductor part is greater than a distance between the ground wiring and the second semiconductor part.

14. The semiconductor device according to claim 12, wherein, in plan view and in the extending direction, a distance between the power supply wiring and the second semiconductor part is smaller than a distance between the ground wiring and the second semiconductor part.

15. The semiconductor device according to claim 2, wherein the silicide layer includes a cobalt.

16. A method of manufacturing a semiconductor device, the method comprising:
(a) providing a semiconductor substrate;
(b) forming an insulating layer on a main surface of the semiconductor substrate;
(c) forming a polycrystalline silicon layer on the insulating layer, the polycrystalline silicon layer including a first semiconductor part and a second semiconductor part adjacent the first semiconductor part;
(d) implanting an impurity of a first conductivity type into a part of the first semiconductor part to form a first conductivity-type region;
(e) implanting an impurity of a second conductivity type into another part of the first semiconductor part and into the second semiconductor part to form a second conductivity-type region; and
(f) forming a silicide layer on an upper surface of the first conductivity-type region and an upper surface of the second conductivity-type region;
wherein the first semiconductor part has a first length in a width direction of the first semiconductor part,
wherein, in the width direction, the second semiconductor part has a second length greater than the first length, and
wherein a distance between the first semiconductor region and the second semiconductor part is 100 nm or more in an extending direction in which the first semiconductor part extends.

17. The method of manufacturing a semiconductor device according to claim 16, the method comprising: (g), after the forming the silicide layer, forming a multilayer wiring layer on the semiconductor substrate so as to cover the polycrystalline silicon layer,
wherein the multilayer wiring layer includes a via reaching the second semiconductor.

18. The method of manufacturing a semiconductor device according to claim 17,
wherein, in the width direction, a second length of the second semiconductor part is 1.5 times or more of the first length.

19. The method of manufacturing a semiconductor device according to claim 18,
wherein, in the implanting the impurity of the first conductivity type, the impurity of the first conductivity type is implanted into parts located on both sides of the polycrystalline silicon layer in plan view, of the semiconductor substrate, and wherein, in the implanting the impurity of the second conductivity type, the impurity of the second conductivity type is implanted into parts located on both sides of the polycrystalline silicon layer in plan view, of another part of the semiconductor substrate.

\* \* \* \* \*